United States Patent
Kim et al.

(10) Patent No.: US 9,660,036 B2
(45) Date of Patent: May 23, 2017

(54) GRAPHENE LAYER, METHOD OF FORMING THE SAME, DEVICE INCLUDING GRAPHENE LAYER AND METHOD OF MANUFACTURING THE DEVICE

(71) Applicant: SAMSUNG ELECTRONICS CO., LTD., Suwon-si (KR)

(72) Inventors: Hyowon Kim, Seongnam-si (KR); Jaeho Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/928,026

(22) Filed: Oct. 30, 2015

(65) Prior Publication Data

US 2016/0126317 A1     May 5, 2016

(30) Foreign Application Priority Data

Oct. 31, 2014   (KR) .................. 10-2014-0150628

(51) Int. Cl.
*H01L 29/16*     (2006.01)
*H01L 21/02*     (2006.01)
(Continued)

(52) U.S. Cl.
CPC ...... *H01L 29/1606* (2013.01); *C01B 31/0453* (2013.01); *H01L 21/02527* (2013.01);
(Continued)

(58) Field of Classification Search
CPC .... H01L 29/1606; H01L 29/66015–29/66045; C01B 31/0453; C01B 31/0461
See application file for complete search history.

(56) References Cited

U.S. PATENT DOCUMENTS 8,580,658 B1 * 11/2013 Davis .................. H01L 21/0237
257/9
8,629,427 B2    1/2014 Banerjee et al.
(Continued)

FOREIGN PATENT DOCUMENTS

EP           2682367 A2       1/2014
KR    10-2012-0099910 A      9/2012
(Continued)

OTHER PUBLICATIONS

Giovannetti et al., 'Doping graphene with metal contacts,' 2008 Phys. Rev. Lett., vol. 101, p. 026803.*
(Continued)

*Primary Examiner* — Bryan Junge
(74) *Attorney, Agent, or Firm* — Sughrue Mion, PLLC

(57) ABSTRACT

A graphene layer, a method of forming the graphene layer, a device including the graphene layer, and a method of manufacturing the device are provided. The method of forming the graphene layer may include forming a first graphene at a first temperature using a first source gas and forming a second graphene at a second temperature using a second source gas. One of the first and second graphenes may be a P-type graphene, and the other one of the first and second graphenes may be an N-type graphene. The first graphene and the second graphene together form a P—N junction.

36 Claims, 28 Drawing Sheets

(51) Int. Cl.
  *H01L 29/66* (2006.01)
  *C01B 31/04* (2006.01)
  *H01L 51/00* (2006.01)
  *H01L 51/05* (2006.01)
(52) U.S. Cl.
  CPC .. *H01L 21/02573* (2013.01); *H01L 21/02645* (2013.01); *H01L 29/6603* (2013.01); *H01L 51/0045* (2013.01); *H01L 51/0558* (2013.01); *C01B 2204/02* (2013.01); *C01B 2204/22* (2013.01); *C01B 2204/30* (2013.01)

(56) References Cited

U.S. PATENT DOCUMENTS

| | | | | |
|---|---|---|---|---|
| 2010/0021708 | A1* | 1/2010 | Kong | B82Y 30/00 |
| | | | | 428/220 |
| 2010/0051897 | A1 | 3/2010 | Chen et al. | |
| 2011/0186805 | A1* | 8/2011 | Bowers | H01L 29/1606 |
| | | | | 257/9 |
| 2012/0161098 | A1* | 6/2012 | Hiura | C23C 16/0218 |
| | | | | 257/9 |
| 2012/0193610 | A1 | 8/2012 | Kim | |
| 2012/0247545 | A1 | 10/2012 | Aria et al. | |
| 2013/0001515 | A1* | 1/2013 | Li | H01L 21/0242 |
| | | | | 257/24 |
| 2013/0028823 | A1* | 1/2013 | Abou-Kandil | C01B 31/0484 |
| | | | | 423/276 |
| 2013/0048948 | A1 | 2/2013 | Heo et al. | |
| 2013/0048952 | A1 | 2/2013 | Chen et al. | |
| 2013/0082234 | A1 | 4/2013 | Bao et al. | |
| 2013/0099194 | A1* | 4/2013 | Maliakal | C01B 31/0446 |
| | | | | 257/9 |
| 2013/0108839 | A1* | 5/2013 | Arnold | C01B 31/0438 |
| | | | | 428/195.1 |
| 2013/0186758 | A1* | 7/2013 | Saha | G01N 27/44791 |
| | | | | 204/452 |
| 2013/0214252 | A1* | 8/2013 | Park | B82Y 30/00 |
| | | | | 257/29 |
| 2014/0014905 | A1 | 1/2014 | Lee et al. | |
| 2014/0054550 | A1 | 2/2014 | Hong et al. | |
| 2014/0097537 | A1* | 4/2014 | Park | H05K 1/09 |
| | | | | 257/741 |
| 2014/0158989 | A1 | 6/2014 | Byun et al. | |
| 2015/0299852 | A1* | 10/2015 | Ozkan | H01G 4/008 |
| | | | | 136/255 |

FOREIGN PATENT DOCUMENTS

| | | |
|---|---|---|
| KR | 10-1284059 B1 | 7/2013 |
| KR | 10-2014-0010720 A | 1/2014 |
| WO | 2011/139236 A1 | 11/2011 |

OTHER PUBLICATIONS

Imamura et al., 'Synthesis of nitrogen-doped graphene on Pt(111) by chemical vapor deposition,' 2011 J. Phys. Chem. C vol. 115, pp. 10000-10005.*

Low, Tony, 'Ballistic-ohmic quantum Hall plateau transition in a graphene p-n junction,' 2008 Phys. Rev. B vol. 80, p. 205423.*

Rao et al., 'Synthesis, properties, and applications of graphene doped with boron, nitrogen, and other elements,' May 2014, Nano Today, vol. 9, pp. 324-343.*

Communication dated Mar. 22, 2016, issued by the European Patent Office in counterpart European Application No. 15192138.4.

Gebhardt et al., "Growth and electronic structure of boron-doped graphene", American Physical Society, Physical Review B 87, Apr. 29, 2013, 9 total pages.

Zhao et al., "Visualizing Individual Nitrogen Dopants in Monolayer Graphene", Science, vol. 333, Aug. 19, 2011, 6 total pages, retrieved from <www.sciencemag.org>.

Sojoudi et al., "Creating Graphene p-n Junctions Using Self-Assembled Monolayers", ACS Applied Material & Interfaces, Aug. 21, 2012, pp. 4781-4786.

Baltazar et al., "Facile Formation of Graphene P-N Junctions Using Self-Assembled Monolayers", The Journal of Physical Chemistry, vol. 116, Aug. 15, 2012, pp. 19095-19103.

Wang et al., "Homo- and Hetero- p-n Junctions Formed on Graphene Steps", Applied Materials & Interfaces, vol. 6, Nov. 1, 2013, pp. 3-8.

* cited by examiner

< FIRST TEMPERATURE (T10) >

< SECOND TEMPERATURE (T20) >

< FIRST TEMPERATURE (T11) >

< SECOND TEMPERATURE (T21) >

< FIRST TEMPERATURE (T12) >

< SECOND TEMPERATURE (T22) >

< FIRST TEMPERATURE (T13) >

< SECOND TEMPERATURE (T23) >

< THIRD TEMPERATURE (T33) >

< FIRST TEMPERATURE (T14) >

< SECOND TEMPERATURE (T24) >

< THIRD TEMPERATURE (T34) >

< FIRST TEMPERATURE (T15) >

< SECOND TEMPERATURE (T25) >

< FIRST TEMPERATURE (T16) >

< SECOND TEMPERATURE (T26) >

< COMPARISON EXAMPLE >

< COMPARISON EXAMPLE >

GRAPHENE LAYER, METHOD OF FORMING THE SAME, DEVICE INCLUDING GRAPHENE LAYER AND METHOD OF MANUFACTURING THE DEVICE

CROSS-REFERENCE TO RELATED APPLICATION

This application claims benefit to Korean Patent Application No. 10-2014-0150628, filed on Oct. 31, 2014, in the Korean Intellectual Property Office, the entire disclosure of which is incorporated by reference herein in its entirety.

BACKGROUND

1. Field

The present disclosure relates to graphene layers, methods of forming the graphene layers, devices including the graphene layers, and methods of manufacturing the devices.

2. Description of the Related Art

Graphene is chemically and structurally stable, and exhibits excellent electrical and physical properties. For example, graphene has a charge mobility of up to about $2 \times 10^5$ cm$^2$/Vs, which is more than one hundred times faster than that of silicon (Si), and has a current density of about $10^8$ A/cm$^2$, which is more than one hundred times greater than that of copper (Cu). Also, graphene may have a very high Fermi velocity Vf. Thus, graphene has drawn attention as a next-generation material for overcoming present limitations of devices in general.

Because of the various advantages of graphene, many studies have been conducted regarding the application of graphene to various electronic devices. In this regard, it is necessary to provide graphene with semiconductor properties. However, when using existing methods, it may be difficult to form in graphene a P—N junction having excellent properties.

SUMMARY

One or more exemplary embodiments provide graphene layers having excellent physical properties and characteristics, and methods of forming the graphene layers.

One or more exemplary embodiments also provide graphene layers having excellent P—N junction characteristics, and methods of forming the graphene layers.

One or more exemplary embodiments also provide graphene layers in which the width of a depletion region existing in a P—N junction interface is relatively small, and methods of forming the graphene layers.

One or more exemplary embodiments also provide patterned graphene layers and methods of forming such graphene layers.

One or more exemplary embodiments also provide graphene layers having defect-free edge portions and methods of forming the graphene layers.

One or more exemplary embodiments also provide devices (e.g., graphene-containing devices) including the graphene layers.

One or more exemplary embodiments also provide methods of manufacturing devices including such graphene layers.

According to an aspect of an exemplary embodiment, there is provided a method of forming a graphene layer, the method including: forming a first graphene on a first region of an underlayer at a first temperature using a first source gas; and forming a second graphene on a second region adjacent to the first region of the underlayer at a second temperature using a second source gas, wherein one of the first and second graphenes is a P-type graphene, the other one of the first and second graphenes is an N-type graphene, and the first and second graphenes form an P—N junction.

The first source gas and the second source gas may be the same as each other, and the first temperature and the second temperature may be different from each other.

The first source gas and the second source gas each may include a hydrocarbon compound containing nitrogen (N).

The hydrocarbon compound containing nitrogen (N) may include pyridine ($C_5H_5N$).

The first temperature may be greater than or equal to 700° C. and the second temperature may be less than or equal to 550° C.

The first graphene may be a P-type graphene and the second graphene may be an N-type graphene.

The first graphene may be a P-type graphene resulting from doping by the underlayer, and the second graphene may be an N-type graphene resulting from N-type dopants in the second source gas.

The underlayer may include a catalytic metal.

The catalytic metal may include platinum (Pt).

The catalytic metal may also include nickel (Ni), copper (Cu), or iridium (Ir).

The first source gas and the second source gas may be different from each other.

One of the first and second source gases may include a first hydrocarbon compound, the other one of the first and second source gases may include a second hydrocarbon compound, the first hydrocarbon compound may not contain nitrogen (N), and the second hydrocarbon compound may contain nitrogen (N).

The P-type graphene may be formed using the first hydrocarbon compound, and the N-type graphene may be formed using the second hydrocarbon compound.

The first hydrocarbon compound may include at least one selected from benzene ($C_6H_6$), ethylene ($C_2H_4$), acetylene ($C_2H_2$), and triethylborane ($C_6H_{15}B$).

The first hydrocarbon compound may include boron (B).

The second hydrocarbon compound may include pyridine ($C_5H_5N$).

The method may further include forming a third graphene joined to the first graphene or second graphene, wherein the third graphene is a P-type graphene or an N-type graphene.

The graphene layer may have a PNP structure or an NPN structure.

The third graphene may be formed at a temperature that is less than about 550° C. or at a temperature less than about 500° C.

The formation of the underlayer may include: forming an under-material layer on a substrate; and forming a plurality of underlayers, which are separate from each other, by patterning the under-material layer.

According to an aspect of another exemplary embodiment, there is provided a method of manufacturing a graphene-containing device, the method including: forming a graphene layer including a P—N junction by using the method described above; and forming at least a portion of the graphene-containing device, wherein the portion includes the graphene layer.

The graphene layer may be formed on a first substrate, and the portion of the graphene-containing device may be formed on a second substrate after the graphene layer is transferred from the first substrate to the second substrate.

The graphene layer may be formed on a first substrate, and the portion of the graphene-containing device may be formed on the first substrate.

According to an aspect of another exemplary embodiment, a graphene layer includes: a P-type graphene; and an N-type graphene joined to a side of the P-type graphene, wherein a depletion region formed at an interface between the P-type graphene and the N-type graphene has a width that is less than or equal to 5 nm.

The width of the depletion region may be less than or equal to 2 nm.

The entire edge portion of the graphene layer may have a defect-free zigzag structure.

In the P-type graphene or the N-type graphene, deviation in doping concentrations by region may be smaller than about $2.5 \times 10^{12}/cm^2$.

According to an aspect of another exemplary embodiment, a graphene-containing device includes the graphene layer described above.

The graphene-containing device may be a diode and may further include a first electrode connected to the P-type graphene and a second electrode connected to the N-type graphene.

The graphene-containing device may be a transistor, and the graphene layer may be used as a channel layer.

The graphene layer may have a PNP junction structure or an NPN junction structure.

The graphene-containing device may include any one selected from the group consisting of a tunneling device, a binary junction transistor (BJT), a barristor, a field effect transistor (FET), a memory device, a solar cell, a photodetector, a sensor, and a light-emitting device.

According to an aspect of another exemplary embodiment, a graphene device includes: an N-type graphene disposed in a first region; and a P-type graphene disposed in a second region adjacent to the first region, wherein the N-type graphene has a crystalline structure formed from carbon (C) atoms, in which some of the carbon (C) atoms are substituted with first atoms, and the P-type graphene has a crystalline structure formed from only carbon (C) atoms or a structure in which some carbon (C) atoms of the crystalline structure are substituted with second atoms that are different from the first atoms.

The first atoms may include, for example, nitrogen (N) atoms.

The second atoms may include, for example, boron (B) atoms.

A depletion region formed at an interface between the P-type graphene and the N-type graphene may have a width that is less than or equal to 5 nm.

The width of the depletion region less than or equal to 2 nm.

The entire edge portion of the graphene layer may have a defect-free zigzag structure.

In the P-type graphene or the N-type graphene, deviation in doping concentrations by region may be smaller than about $2.5 \times 10^{12}/cm^2$.

The width of the graphene layer may be, for example, about 500 nm or less.

BRIEF DESCRIPTION OF THE DRAWINGS

The above and/or other aspects will become apparent and more readily appreciated from the following description of exemplary embodiments, taken in conjunction with the accompanying drawings in which.

DETAILED DESCRIPTION

Figure 1A:
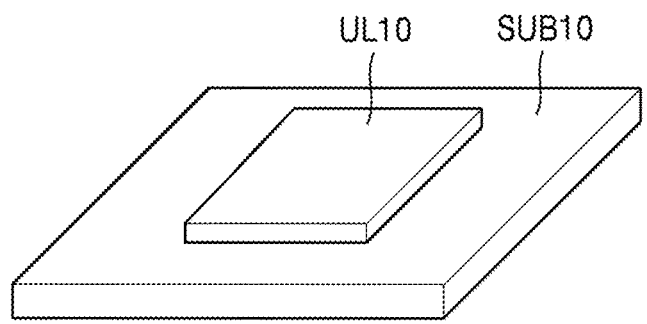
FIGS. 1A through 1E are perspective views illustrating a method of forming a graphene layer, according to an exemplary embodiment.

Various exemplary embodiments will now be described more fully with reference to the accompanying drawings in which exemplary embodiments are shown.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized embodiments (and intermediate structures) of exemplary embodiments. As such, variations from the shapes of the illustrations as a result, for example, of manufacturing techniques and/or tolerances, are to be expected. Thus, exemplary embodiments should not be construed as being limited to the particular shapes of the regions illustrated herein, but rather they include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which the exemplary embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, graphene layers, methods of forming the graphene layers, devices including the graphene layers, and methods of manufacturing the devices, according to exemplary embodiments, will be described in detail with reference to the accompanying drawings. In the drawings, the width and thickness of layers and regions may be exaggerated for clarity. The same reference numerals represent the same elements throughout the drawings.

FIGS. 1A through 1E are perspective views illustrating a method of forming a graphene layer, according to an exemplary embodiment.

Referring to FIG. 1A, an underlayer UL10 may be formed on a substrate SUB10. The substrate SUB10 may be, for example, a silicon (Si) substrate. However, the substrate SUB10 may be a substrate other than an Si substrate. The underlayer UL10 may be a material layer including a catalyst for forming graphene on the underlayer UL10. The catalyst may be a metal. Accordingly, the underlayer UL10 may be referred to as a catalytic metal layer. Specifically, the underlayer UL10 may include platinum (Pt) as the catalyst. In this case, the underlayer UL10 may be a Pt layer. However, the catalyst included in the underlayer UL10 is not limited to Pt and may be varied. For example, the catalyst may include, for example, Ni, Cu, or Ir instead of Pt.

Figure 1B:
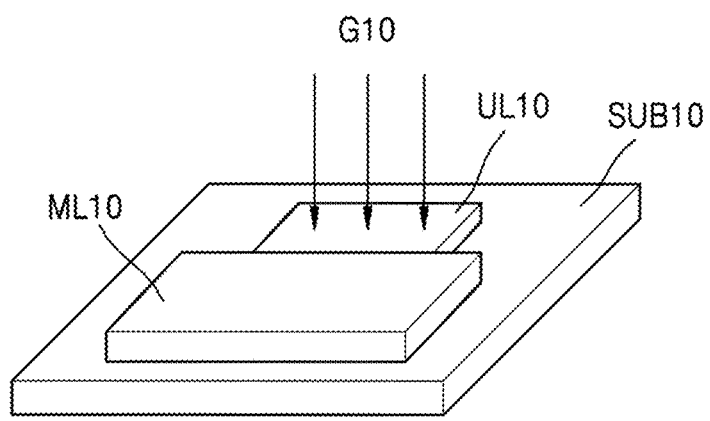

Referring to FIG. 1B, a mask layer ML10 may be formed on the substrate SUB10 so as to cover a portion of the underlayer UL10. The mask layer ML10 may be formed from metal, a metal compound, oxide, nitride, or the like, and may also be formed from a polymer material that may be used at a high temperature (for example, at a temperature of about 500° C. or more). An exposed region of the underlayer region UL10 that is not covered by the mask layer ML10 may be referred to as a first region.

Next, a process of forming graphene may be performed at a first temperature T10 by using a first source gas G10. The material of the first source gas G10 may be adsorbed onto the exposed region (i.e., the first region) of the underlayer UL10 by injecting the first source gas G10 into a chamber (not shown) containing the substrate SUB10, and the substrate SUB10 or the chamber may be heated at the first temperature T10. The heating process may be performed after injecting the first source gas G10 into the chamber, or the first source gas G10 may be injected into the chamber after the heating process has been completed. Alternatively, the heating process and the injection process may be performed at the same time.

Figure 1C:
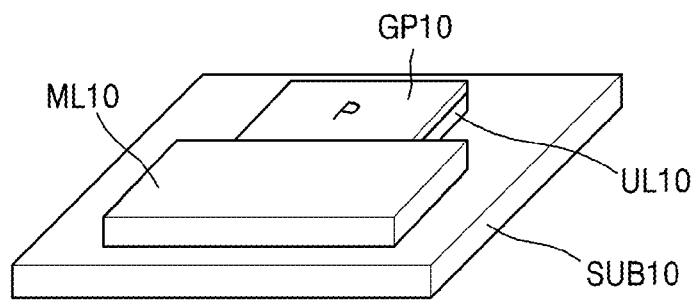

As a result of the graphene formation process described with reference to FIG. 1B, a first graphene GP10 may be formed on the first region of the underlayer UL10, as illustrated in FIG. 1C. The first graphene GP10 may be a first type of semiconductor layer. For example, the first graphene GP10 may be a P-type graphene. In FIGS. 1B and 1C, the process of forming the first graphene GP10 may be a chemical vapor deposition (CVD) process. Forming the first graphene GP10 by using the source gas G10 and the first temperature T10 will be described later in detail.

Figure 1D:
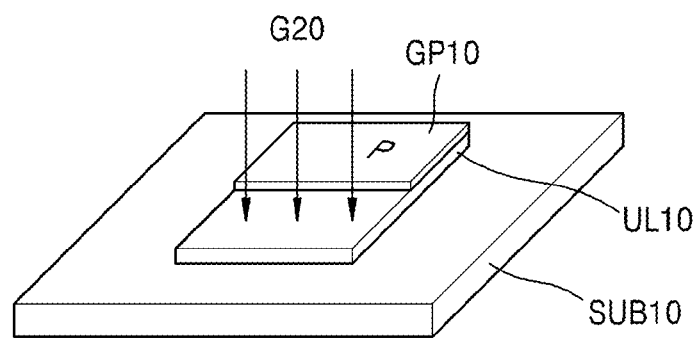

Referring to FIG. 1D, a region of the underlayer UL10 covered by the mask layer ML10 of FIG. 1C may be exposed by removing the mask layer ML10. In this case, the region of the underlayer UL10 exposed by removing the mask layer ML10 may be referred to as a second region. The second region of the underlayer UL10 may be adjacent to the first region.

Next, a process of forming graphene may be performed at a second temperature T20 by using a second source gas G20. The material of the second source gas G20 may be adsorbed onto the exposed region (i.e., the second region) of the underlayer UL10 by injecting the second source gas G20 into the chamber (not shown) containing the substrate SUB10, and the substrate SUB10 or the chamber may be heated at the second temperature T20. The heating process may be performed after injecting the second source gas G20 into the chamber, or the second source gas G20 may be injected into the chamber after the heating process has been completed. Alternatively, the heating process and the injection process may be performed at the same time.

Figure 1E:
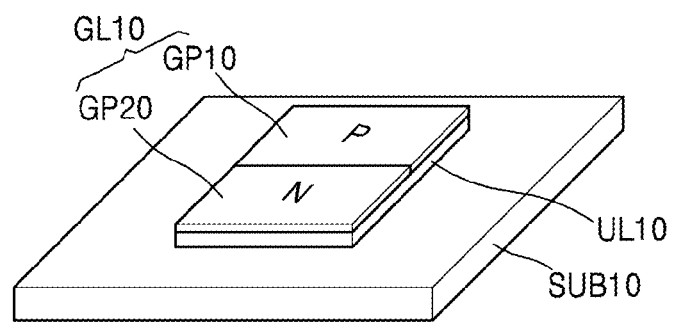

As a result of the graphene formation process described with reference to FIG. 1D, a second graphene GP20 may be formed on the second region of the underlayer UL10, as illustrated in FIG. 1E. The second graphene GP20 may be a second type of semiconductor. For example, the second graphene GP20 may be an N-type graphene. As shown in FIG. 1E, the first graphene GP10 and the second graphene GP20 may be joined together. The second graphene GP20 may be joined to the side of the first graphene GP10. Accordingly, the first and second graphenes GP10 and GP20 may form a P—N junction. The combined first and second graphene GP10 and GP20 may be jointly referred to as a graphene layer GL10. The graphene layer GL10 may have a P—N junction.

In the current exemplary embodiment, the first source gas G10 of FIG. 1B and the second source gas G20 of FIG. 1D may be the same as each other. In this case, the first source gas G10 and the second source gas G20 may each include a hydrocarbon compound containing nitrogen (N). The hydrocarbon compound containing nitrogen (N) may include, for example, pyridine ($C_5H_5N$). That is, both the first source gas G10 and the second source gas G20 may include a $C_5H_5N$ gas. In this manner, although the same source gas is used as the first source gas G10 and the second source gas G20, the first and second graphenes GP10 and GP20 having different semiconductor types may be formed by using different processing temperatures, i.e., the first and second temperatures T10 and T20. The first temperature T10 may be higher than the second temperature T20. The first temperature T10, which is used for forming the first graphene GP10, may be about 700° C. or more, and the second temperature T20, which is used for forming the second graphene GP20, may be about 550° C. or less. More specifically, the first temperature T10 may be from about 700° C. to about 1200° C., and the second temperature T20 may be from about 450° C. to about 550° C.

In FIG. 1B, when the first source gas G10 includes $C_5H_5N$ and the first temperature T10 is about 700° C. or more, the nitrogen (N) and hydrogen (H) in the $C_5H_5N$ may decompose and thus be eliminated. Accordingly, the first graphene GP10 of FIG. 1C may not include nitrogen (N) atoms. Nitrogen (N) atoms may act as N-type dopants with respect to graphene. However, as discussed above, nitrogen (N) atoms may not be present in the first graphene GP10. In this case, the first graphene GP10 may be formed so as to be a P-type graphene as a result of doping effects caused by the underlayer UL10. More specifically, the Dirac point of the first graphene GP10 may increase to hundreds of millivolts (for example, about 300 mV) above the Fermi level because of a component (e.g., Pt) of the underlayer UL10, and as a result, the first graphene GP10 may have P-type semiconductor properties.

In FIG. 1D, when the second source gas G20 includes $C_5H_5N$ and the second temperature T20 is about 550° C. or less, instead of being eliminated, the nitrogen (N) in the $C_5H_5N$ may remain. Accordingly, the nitrogen (N), in combination with carbon (C), may be used for forming graphene (the second graphene GP20 of FIG. 1E). Thus, the second graphene GP20 of FIG. 1E may include nitrogen (N) atoms. Since the nitrogen (N) atoms may be N-type dopants, the second graphene GP20 may have N-type properties due to the nitrogen (N) atoms. The number of nitrogen (N) atoms included in the second graphene GP20 varies according to changes in the second temperature T20, and as a result, the doping concentration of the second graphene GP20 may vary depending on the second temperature T20. When the second temperature T20 is relatively low (for example, about 450° C.), the N-doping concentration in the second graphene GP20 may increase. Conversely, when the second temperature T20 is relatively high (for example, about 550° C.), the N-doping concentration in the second graphene GP20 may decrease. Accordingly, the doping concentration of the second graphene GP20 may be easily controlled by adjusting the second temperature T20 within a predetermined range.

As described above, a P-type graphene (i.e., the first graphene GP10) and an N-type graphene (i.e., the second graphene GP20) may be formed by using one type of source gas while varying the process temperature used in a graphene formation process. Since only one type of source gas is used, processes to produce graphene may be simplified, manufacturing costs may be reduced, and manufacturing time may be reduced. In addition, a junction (i.e., P—N junction) formed between the P-type graphene (i.e., the first graphene GP10) and the N-type graphene (i.e., the second graphene GP20) formed by the method described above may have excellent characteristics. In addition, since the P-type and N-type graphenes (i.e., the first and second graphenes GP10 and GP20) may have structures that are not defective or have few defects, the graphene layer GL10 formed from the P-type and N-type graphenes may have excellent characteristics and properties. The crystalline structure and characteristics of the graphene layer GL10 will be described later in more detail with reference to FIG. 9.

When forming the second graphene GP20 by using the second source gas G20 and the second temperature T20 after the first graphene GP10 is formed, carbon (C) atoms reach a stable state in terms of potential energy. In this regard, the second graphene GP20 may be formed adjacent to the first graphene GP10. Accordingly, the boundary between the first graphene GP10 and the second graphene GP20 may not have defects or may have few defects. That is, the bond between the first graphene GP10 and the second graphene GP20 may be practically a chemical bond. In addition, since the first graphene GP10 and the second graphene GP20 may be formed only on the surface of the underlayer UL10, the first graphene GP10 and the second graphene GP20 may each have a single atomic layer structure or a structure similar thereto.

In the exemplary embodiment illustrated by FIGS. 1A through 1E, a method of forming the P-type and N-type graphenes GP10 and GP20 by using the same source gas for both the first source gas G10 and the second source gas G20 has been described. However, according to another exemplary embodiment to be illustrated in FIGS. 2A through 2D, P-type and N-type graphenes may be formed by using different source gases.

FIGS. 2A through 2D are perspective views illustrating a method of forming a graphene layer, according to another exemplary embodiment.

Figure 2A:
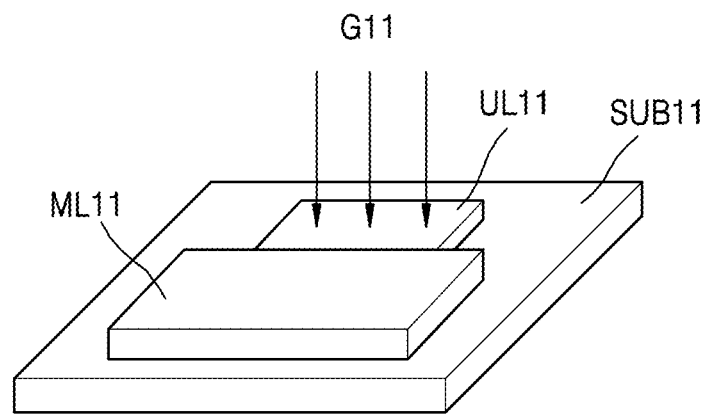
FIGS. 2A through 2D are perspective views illustrating a method of forming a graphene layer, according to another exemplary embodiment.

Referring to FIG. 2A, a mask layer ML11 covering a portion of an underlayer UL11 may be formed after forming the underlayer UL11 on a substrate SUB11. This structure may be similar to the structure of FIG. 1B in which the underlayer UL10 and the mask layer ML10 are formed on the substrate SUB10. The underlayer UL11 may include a catalyst, such as Pt, Ni, Cu, or Ir, and the mask layer ML11 may be formed from metal, a metal compound, oxide, nitride, or polymer. Next, a process of forming graphene may be performed at a first temperature T11 by using a first source gas G11.

Figure 2B:
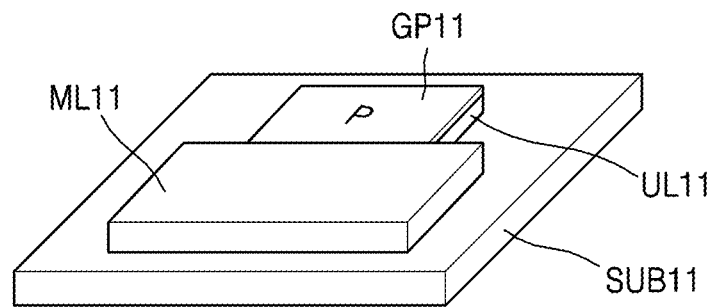

As a result of the graphene formation process of FIG. 2A, a first graphene GP11 may be formed on a region (a first region) of the underlayer UL11, not covered by the mask layer ML11, as illustrated in FIG. 2B. The first graphene GP11 may be, for example, a P-type graphene.

Figure 2C:
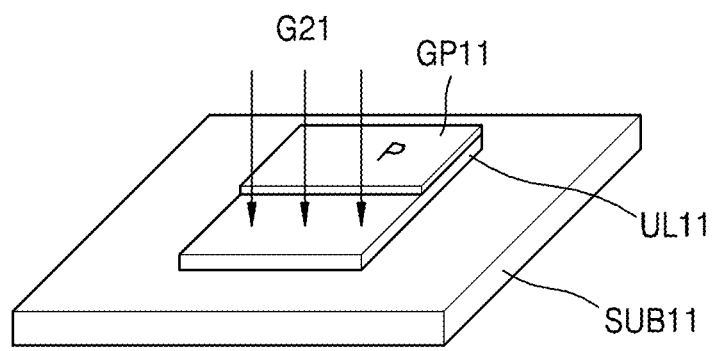

Referring to FIG. 2C, a process of forming graphene may be performed at a second temperature T21 by using a second source gas G21 after removing the mask layer ML11.

Figure 2D:
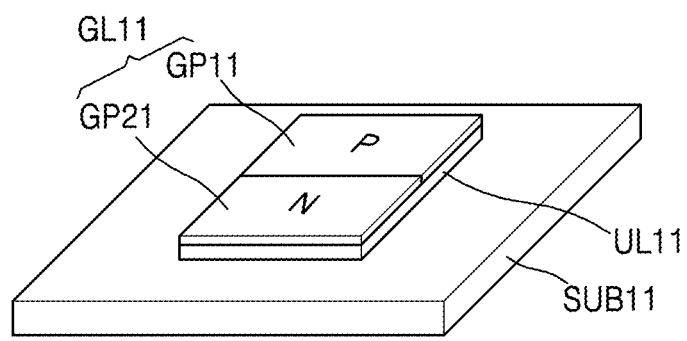

As a result of the graphene formation process of FIG. 2C, a second graphene GP21 joined to the first graphene GP11 may be formed as illustrated in FIG. 2D. The second graphene GP21 may be, for example, an N-type graphene. The combined first and second graphenes GP11 and GP21 may be jointly referred to as graphene layer GL11.

In the current exemplary embodiment, the first source gas G11 of FIG. 2A and the second source gas G21 of FIG. 2C may be different from each other. For example, the first source gas G11 may include a first hydrocarbon compound and the second source gas G21 may include a second hydrocarbon compound. The first hydrocarbon compound may not contain nitrogen (N), and the second hydrocarbon compound may contain N. For example, the first source gas G11 may include a hydrocarbon compound, such as benzene ($C_6H_6$), ethylene ($C_2H_4$), or acetylene ($C_2H_2$). $C_6H_6$, $C_2H_4$, and $C_2H_2$ are compounds formed of only carbon (C) and hydrogen (H). The first source gas G11 may also include a hydrocarbon compound containing boron (B), for example, triethylborane ($C_6H_{15}B$). Accordingly, the first source gas G11 may include at least one of $C_6H_6$, $C_2H_4$, $C_2H_2$, and $C_6H_{15}B$. The second source gas G21 may include a hydrocarbon compound containing nitrogen (N), for example, $C_5H_5N$. When the first source gas G11 and the source gas G21 are different from each other in this manner, the first temperature T11 and the second temperature T21 may be different from each other or the same as each other. The first temperature T11 may be higher than the second temperature T21 or vice versa. In some cases, the first temperature T11 and the second temperature T21 may be the same as or similar to each other.

In FIG. 2A, when the first source gas G11 includes $C_6H_6$, $C_2H_4$, or $C_2H_2$, the first temperature T11 may be from about 450° C. to about 1200° C. When the first source gas G11 includes $C_6H_{15}B$, the first temperature T11 may be from about 320° C. to about 630° C. In this condition, the first graphene GP11 of FIG. 2B may be formed so as to be a P-type graphene. Accordingly, the first temperature T11 may be within the range of from about 320° C. to about 1200° C. When the first source gas G11 includes a hydrocarbon compound, such as $C_6H_6$, $C_2H_4$, or $C_2H_2$, the first graphene GP11 may be formed from only carbon (C) atoms and may have P-type semiconductor characteristics as a result of the underlayer UL11. When the first gas G11 is a hydrocarbon compound containing boron (B), such as $C_6H_{15}B$, the first graphene GP11 may be formed so as to include boron (B) atoms and may have P-type semiconductor characteristics as a result of the boron (B) atoms. The boron (B) atoms may act as P-type dopants with respect to the graphene.

In FIG. 2C, when the second source gas G21 includes $C_5H_5N$, the second temperature T21 may be about 550° C. or less. In this case, the formed graphene (i.e., the second graphene GP21 of FIG. 2D) may be an N-type graphene including nitrogen (N) atoms. The second graphene GP21 may be the same as the second graphene GP20 described with reference to FIGS. 1D and 1E. The range of the second temperature T21 may be from about 450° C. to about 550° C.

In the exemplary embodiment of FIGS. 2A through 2D, the first graphene GP11 may be a P-type graphene and the second graphene GP21 may be an N-type graphene, as described above. However, in another exemplary embodiment, illustrated in FIGS. 3A through 3D, a P-type graphene may be formed after forming an N-type graphene.

FIGS. 3A through 3D are perspective views illustrating a method of forming a graphene layer, according to another exemplary embodiment.

Figure 3A:
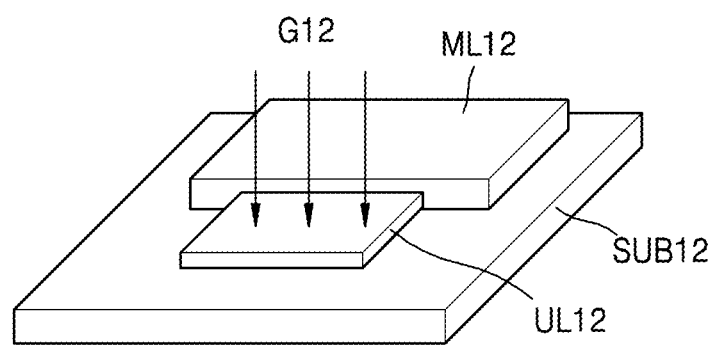
FIGS. 3A through 3D are perspective views illustrating a method of forming a graphene layer, according to another exemplary embodiment.

Referring to FIG. 3A, an underlayer UL12 may be formed on a substrate SUB12 and a mask layer ML12 may be formed to cover a portion of the underlayer UL12. The material of the substrate SUB12, the material of the underlayer UL12, and the material of the mask layer ML12 may be the same as or similar to the material of the substrate SUB11, the material of the underlayer UL11, and the material of the mask layer ML11, respectively. Next, a process of forming graphene may be performed at a first temperature T12 by using a first source gas G12.

Figure 3B:
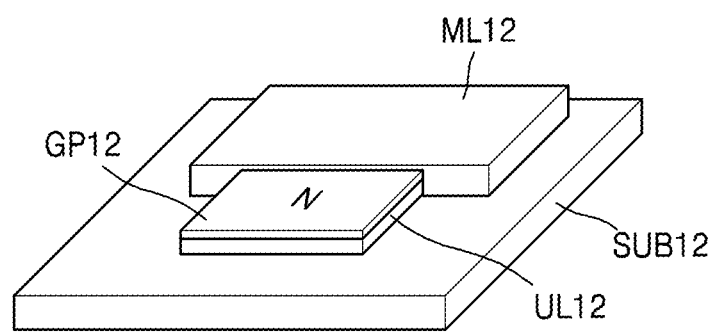

As a result of the graphene formation process of FIG. 3A, a first graphene GP12 may be formed on a region (a first region) of the underlayer UL12, not covered with the mask layer ML12, as illustrated in FIG. 3B. The first graphene GP12 may be, for example, an N-type graphene.

Figure 3C:
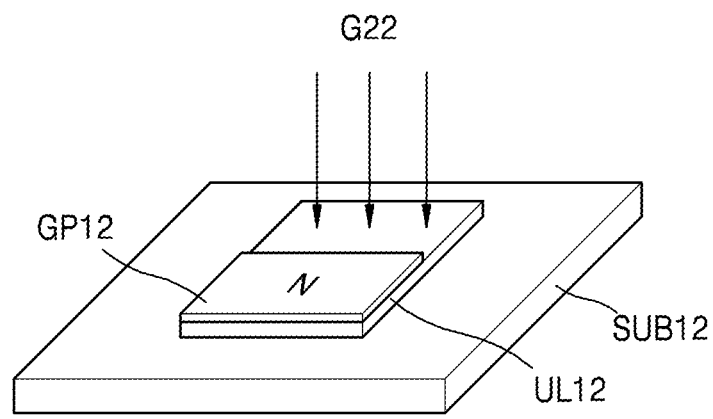

Referring to FIG. 3C, a process of forming graphene may be performed at a second temperature T22 by using a second source gas G22 after removing the mask layer ML12.

Figure 3D:
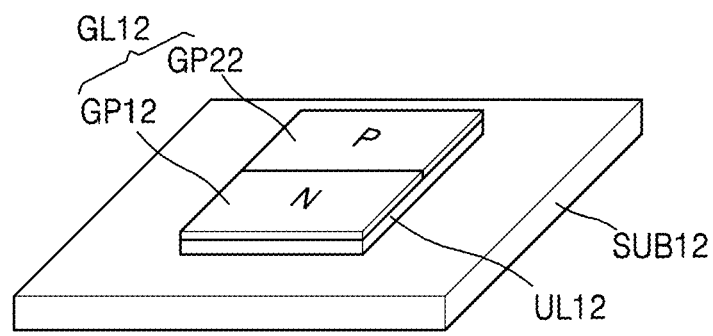

As a result of the graphene formation process of FIG. 3C, a second graphene GP22 joined to the first graphene GP12 may be formed as illustrated in FIG. 3D. The second graphene GP22 may be, for example, a P-type graphene. The combined first and second graphenes GP12 and GP22 may be jointly referred to as a graphene layer GL12.

In the current exemplary embodiment, the first source gas G12 of FIG. 3A and the second source gas G22 of FIG. 3C may be different from each other. The first source gas G12 may be the same as or similar to the second source gas G21 of FIG. 2C, and the second source gas G22 may be the same as or similar to the first source gas G11 of FIG. 2A. For example, the first source gas G12 may include a second hydrocarbon compound and the second source gas G22 may include a first hydrocarbon compound as previously described. The second hydrocarbon compound may contain nitrogen (N), and the first hydrocarbon compound may not contain nitrogen (N). Specifically, the first source gas G12 may include a hydrocarbon compound containing nitrogen (N), for example, $C_5H_5N$. The second source gas G22 may include a hydrocarbon compound containing boron (B), for example, $C_6H_{15}B$ or may include a hydrocarbon compound, such as $C_6H_6$, $C_2H_4$, or $C_2H_2$. When the first graphene GP12 that is formed by using the first source gas G12 is an N-type graphene and the second graphene GP22 that is formed by using the second source gas G22 is a P-type graphene, the second temperature T22 that is used for forming the second graphene GP22 may be lower than or the same as the first temperature T12 that is used for forming the first graphene GP12, in order to reduce damage to the first graphene GP12 during the formation of the second graphene GP22.

In FIG. 3A, when the first source gas G12 includes $C_5H_5N$ and the first temperature T12 is about 550° C. or less, the formed graphene (i.e., the first graphene GP12 of FIG. 3B) may be an N-type graphene including nitrogen (N) atoms. In this case, the first temperature T12 may be from about 450° C. to about 550° C.

In FIG. 3C, when the second source gas G22 includes $C_6H_{15}B$, $C_6H_6$, $C_2H_4$, or $C_2H_2$, the second temperature T22 may be controlled so as to be lower than about 550° C. or to be lower than about 500° C. For example, when $C_6H_{15}B$ is used, the P-type graphene (i.e., the second graphene GP22) may be formed at a temperature of about 400° C. or less. When $C_6H_6$, $C_2H_4$, or $C_2H_2$ is used, the P-type graphene (i.e., the second graphene GP22) may be formed at a temperature of around 450° C., around 500° C., or around 530° C. When the second temperature T22 is too high, nitrogen (N) atoms in the first graphene GP12 may decompose, and thus the first graphene GP12 may be damaged. Accordingly, the second temperature T22 may be appropriately controlled so as to prevent damage to the first graphene GP12.

FIGS. 4A through 4F are perspective views illustrating a method of forming a graphene layer, according to another exemplary embodiment.

Figure 4A:
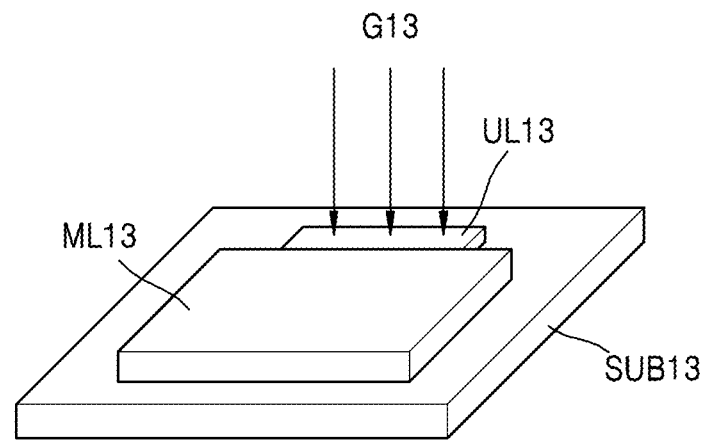
FIGS. 4A through 4F are perspective views illustrating a method of forming a graphene layer, according to another exemplary embodiment.

Referring to FIG. 4A, a mask layer ML13 covering a portion of an underlayer UL13 may be formed after forming the underlayer UL13 on a substrate SUB13. Next, a process of forming graphene may be performed at a first temperature T13 by using a first source gas G13. The first source gas G13 and the first temperature T13 may correspond to the first source gas G10 and the first temperature T10 of FIG. 1B or correspond to the first source gas G11 and the first temperature T11 of FIG. 2A.

Figure 4B:
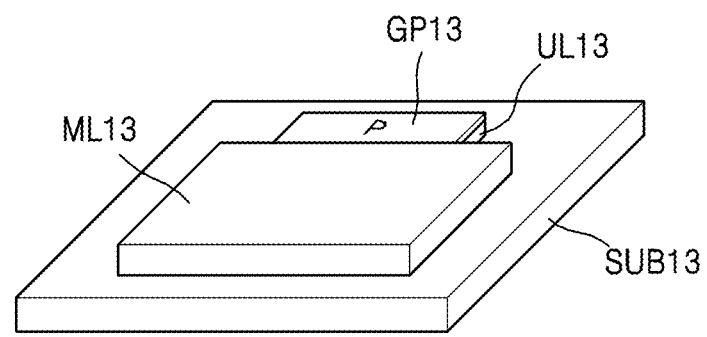

As a result of the graphene formation process of FIG. 4A, a first graphene GP13 may be formed as illustrated in FIG. 4B. The first graphene GP13 may be, for example, a P-type graphene.

Figure 4C:
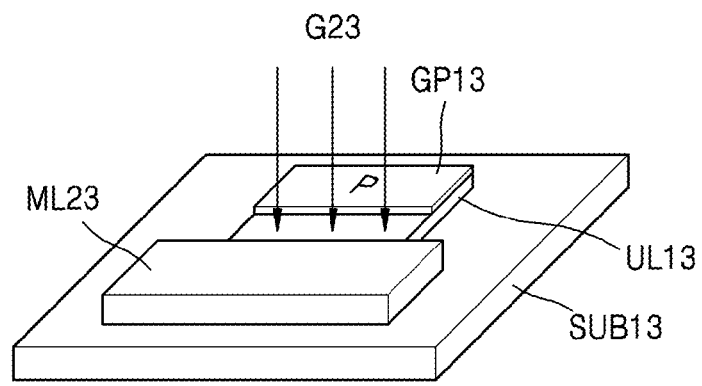

Referring to FIG. 4C, a second mask layer ML23 may be formed after removing the first mask layer ML13. A portion of the underlayer UL13 may be exposed without being covered with the second mask layer ML23. Next, a process of forming graphene may be performed at a second temperature T23 by using a second source gas G23. The second source gas G23 and the second temperature T23 may correspond to the second source gas G20 and the second temperature T20 of FIG. 1D or may correspond to the second source gas G21 and the second temperature T21 of FIG. 2C.

Figure 4D:
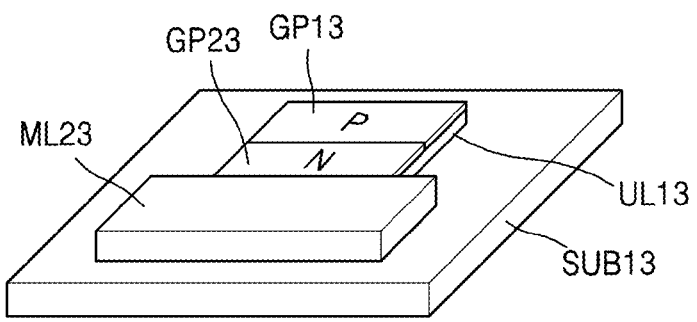

As a result of the graphene formation process of FIG. 4C, a second graphene GP23 may be formed as illustrated in FIG. 4D. The second graphene GP23 may be, for example, an N-type graphene.

Figure 4E:
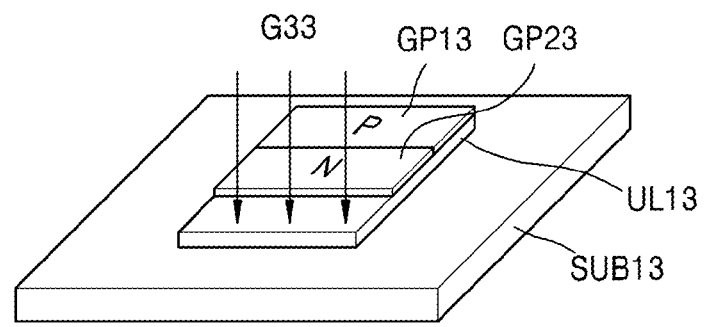

Referring to FIG. 4E, a process of forming graphene may be performed on an exposed region of the underlayer UL13 after removing the second mask layer ML23. In this case, a third source gas G33 and a third temperature T33 may be used. The third source gas G33 and the third temperature T33 may correspond to the second source gas G22 and the second temperature T22 of FIG. 3C. For example, the third source gas G33 may include a hydrocarbon compound containing boron (B), for example, $C_6H_{15}B$ or may include a hydrocarbon compound, such as $C_6H_6$, $C_2H_4$, or $C_2H_2$. The third temperature T33 may be a temperature of about 550° C. or less or about 500° C. or less. In addition, the third temperature may be lower than either the first or the second temperature.

Figure 4F:
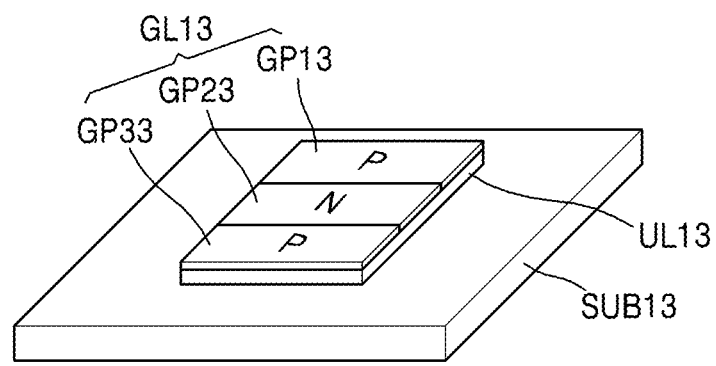

As a result of the graphene formation process of FIG. 4E, a third graphene GP33 may be formed as illustrated in FIG. 4F. The third graphene GP33 may be, for example, a P-type graphene. The third graphene GP33 may be the same as or similar to the second graphene GP22 of FIG. 3D. In FIG. 4F, the first through third graphenes GP13, GP23, and GP33 may jointly form a graphene layer GL13. The graphene layer GL13 may have a PNP junction structure. The sizes and forms of the first through third graphenes GP13, GP23, and GP33 may be variously changed.

Although an example of a method of forming the graphene layer GL13 having the PNP junction structure is illustrated in FIGS. 4A through 4F, a graphene layer having an NPN junction structure may be formed by modifying the example, as illustrated in FIGS. 5A through 5F.

Referring to FIGS. 5A through 5F, a graphene layer GL14 including first through third graphenes GP14, GP24, and GP34 may be formed on an underlayer UL14 on a substrate SUB14. The first graphene GP14 may be an N-type graphene, the second graphene GP24 may be a P-type graphene, and the third graphene GP34 may be an N-type graphene. Accordingly, the graphene layer GL14 may have an NPN junction structure.

Figure 5A:
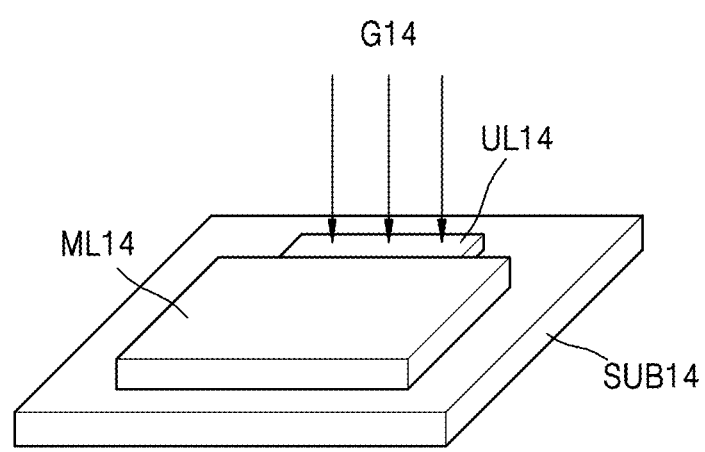
FIGS. 5A through 5F are perspective views illustrating a method of forming a graphene layer, according to another exemplary embodiment.
Figure 5B:
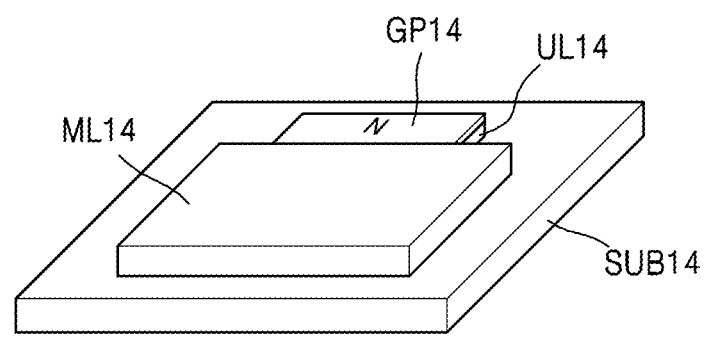
Figure 5C:
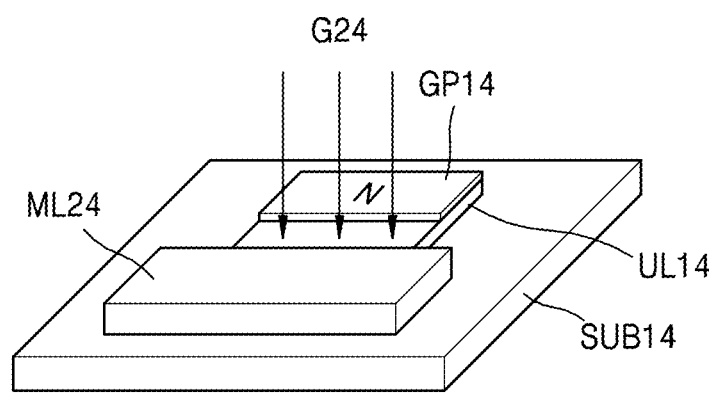
Figure 5D:
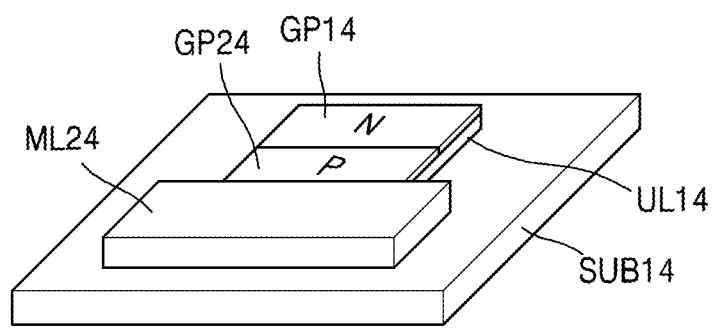
Figure 5E:
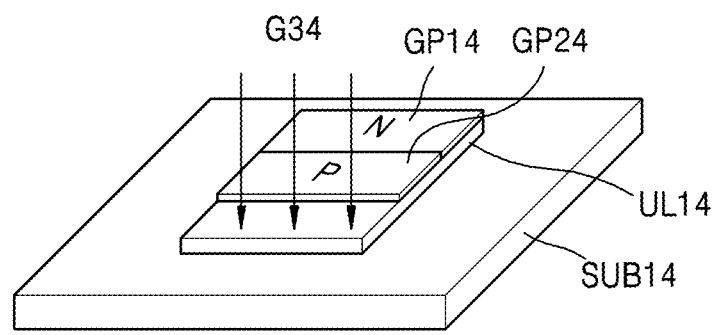
Figure 5F:
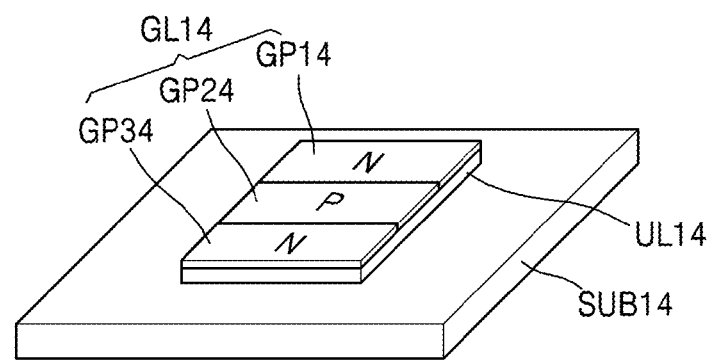

In FIG. 5A, reference numeral ML14 denotes a first mask layer, reference numeral G14 denotes a first source gas, and reference numeral T14 denotes a first temperature. In FIG. 5C, reference numeral ML24 denotes a second mask layer, reference numeral G24 denotes a second source gas, and reference numeral T24 denotes a second temperature. In FIG. 5E, reference numeral G34 denotes a third source gas and reference numeral T34 denotes a third temperature. The first source gas G14 and the first temperature T14 of FIG. 5A may correspond to the first source gas G12 and the first temperature T12 of FIG. 3A. The second source gas G24 and the second temperature T24 of FIG. 5C may correspond to the second source gas G22 and the second temperature T22 of FIG. 3C. The third source gas G34 and the third temperature T34 of FIG. 5E may correspond to the second source gas G20 and the second temperature T20 of FIG. 1D, may correspond to the second source gas G21 and the second temperature T21 of FIG. 2C, or may correspond to the first source gas G14 and the first temperature T14 of FIG. 5A.

The method shown in FIGS. 4A through 4F and the method shown in FIGS. 5A through 5F may be variously modified. Modified examples are illustrated in FIGS. 6A through 6D and FIGS. 7A through 7D.

FIGS. 6A through 6D are perspective views illustrating a method of forming a graphene layer, according to another exemplary embodiment. FIGS. 7A through 7D are perspective views illustrating a method of forming a graphene layer, according to another exemplary embodiment.

Figure 6A:
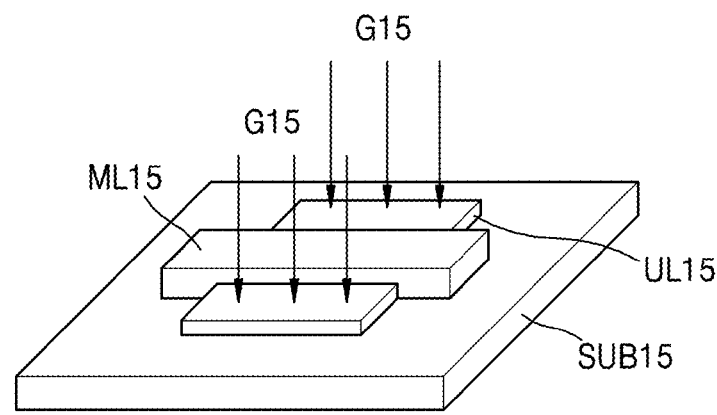
FIGS. 6A through 6D are perspective views illustrating a method of forming a graphene layer, according to another exemplary embodiment.

Referring to FIG. 6A, a mask layer ML15 covering a portion of an underlayer UL15 may be formed after forming the underlayer UL15 on a substrate SUB15. A region of the underlayer UL15 may be exposed at both sides of the mask layer ML15. Next, a process of forming graphene may be performed on the exposed region of the underlayer UL15. In this case, a first source gas G15 and a first temperature T15 may be used. The first source gas G15 and the first temperature T15 may correspond to the first source gas G10 and the first temperature T10 of FIG. 1B or may correspond to the first source gas G11 and the first temperature T11 of FIG. 2A.

Figure 6B:
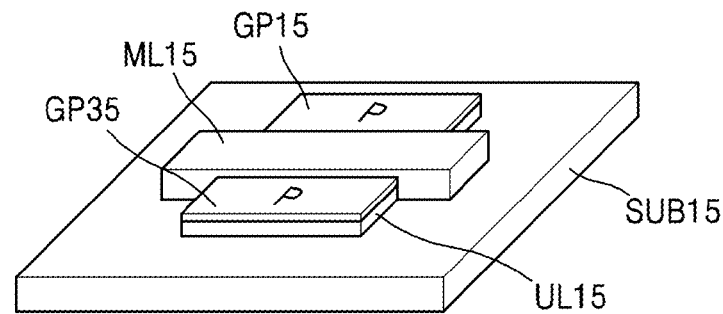

As a result of the graphene formation process of FIG. 6A, a first graphene GP15 and a third graphene GP35 may be formed as illustrated in FIG. 6B. The first graphene GP15 and the third graphene GP35 may be, for example, P-type graphenes.

Figure 6C:
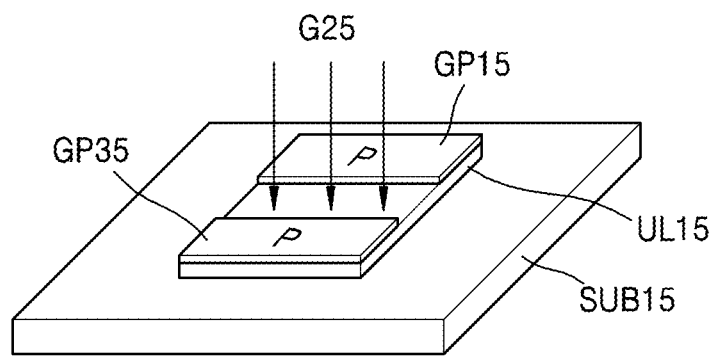

Referring to FIG. 6C, a process of forming graphene may be performed on an exposed region of the underlayer UL15 after removing the mask layer ML15. In this case, a second source gas G25 and a second temperature T25 may be used. The second source gas G25 and the second temperature T25 may correspond to the second source gas G20 and the second temperature T20 of FIG. 1D or may correspond to the second source gas G21 and the second temperature T21 of FIG. 2C.

Figure 6D:
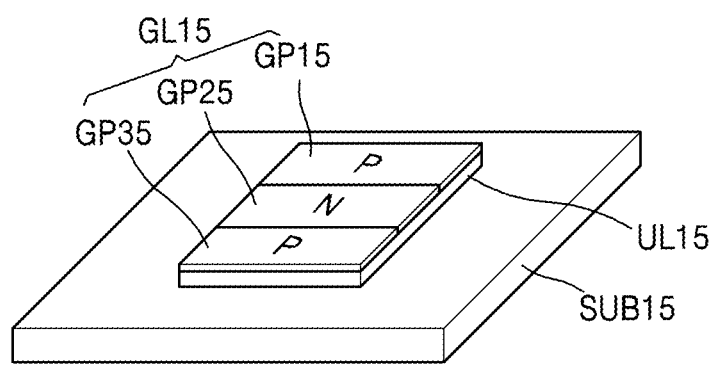

As a result of the graphene formation process of FIG. 6C, a second graphene GP25 may be formed as illustrated in FIG. 6D. The second graphene GP25 may be disposed between the first graphene GP15 and the third graphene GP35. The second graphene GP25 may be, for example, an N-type graphene. Accordingly, a graphene layer GL15 including the first through third graphenes GP15, GP25, and GP35 may have a PNP junction structure.

The method of FIGS. 6A through 6D may be modified as shown in FIGS. 7A through 7D. A graphene layer having an NPN structure may be formed by using a method as illustrated in FIGS. 7A through 7D.

Referring to FIGS. 7A through 7D, a graphene layer GL16 including first through third graphenes GP16, GP26, and GP36 may be formed on an underlayer UL16 on a substrate SUB16. The first graphene GP16 may be an N-type graphene, the second graphene GP26 may be a P-type graphene, and the third graphene GP36 may be an N-type graphene. Accordingly, the graphene layer GL16 may have an NPN junction structure.

Figure 7A:
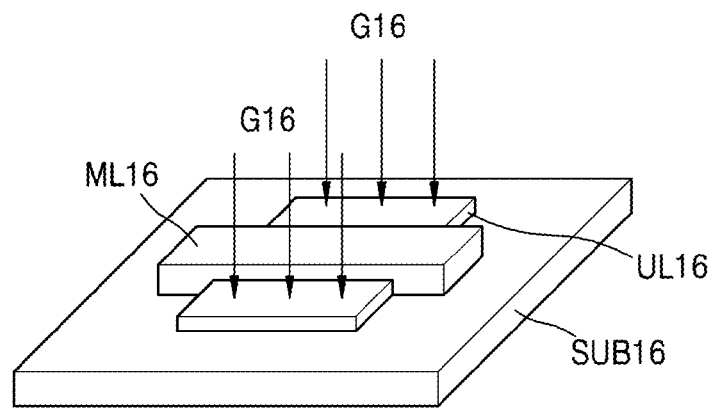
FIGS. 7A through 7D are perspective views illustrating a method of forming a graphene layer, according to another exemplary embodiment.
Figure 7B:
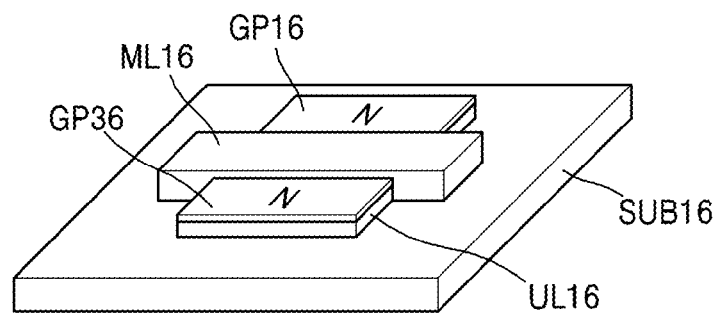
Figure 7C:
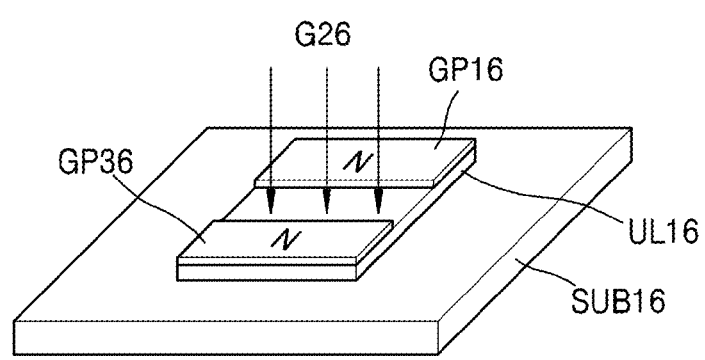
Figure 7D:
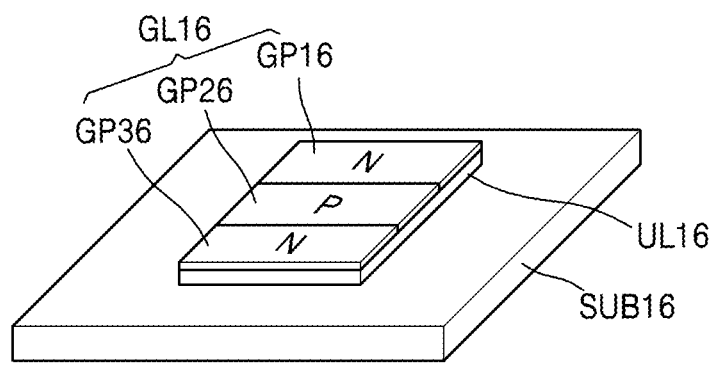

In FIG. 7A, reference numeral ML16 denotes a mask layer, reference numeral G16 denotes a first source gas, and reference numeral T16 denotes a first temperature. In FIG. 7C, reference numeral G26 denotes a second source gas and reference numeral T26 denotes a second temperature. The first source gas G16 and the first temperature T16 of FIG. 7A may correspond to the first source gas G12 and the first temperature T12 of FIG. 3A. The second source gas G26 and the second temperature T26 of FIG. 7C may correspond to the second source gas G22 and the second temperature T22 of FIG. 3C.

Figure 8A:
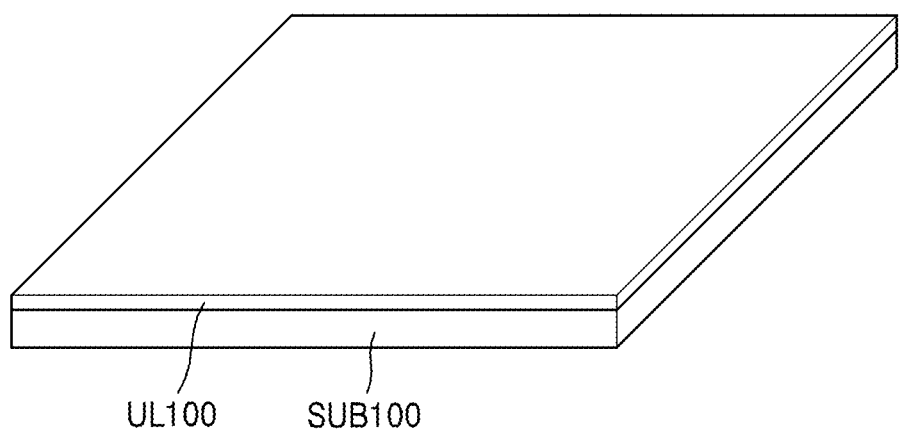
FIGS. 8A through 8C are perspective views illustrating a method of forming a graphene layer, according to another exemplary embodiment.
Figure 8B:
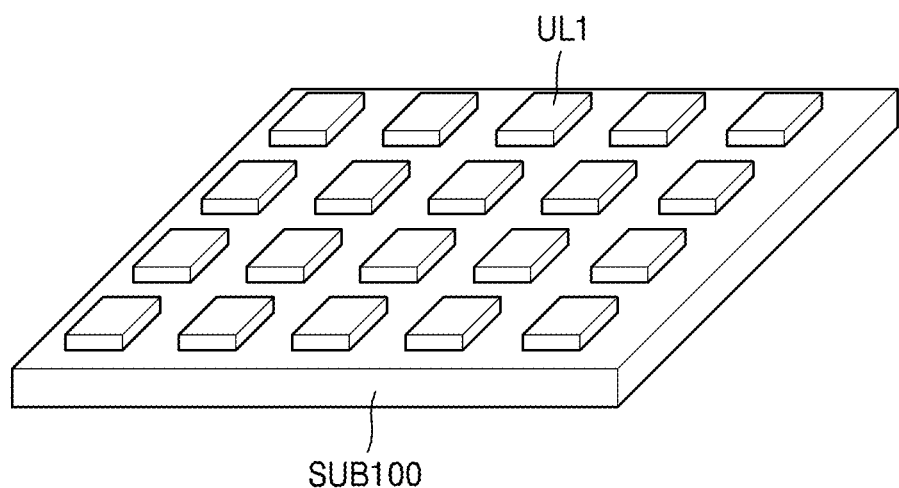
Figure 8C:
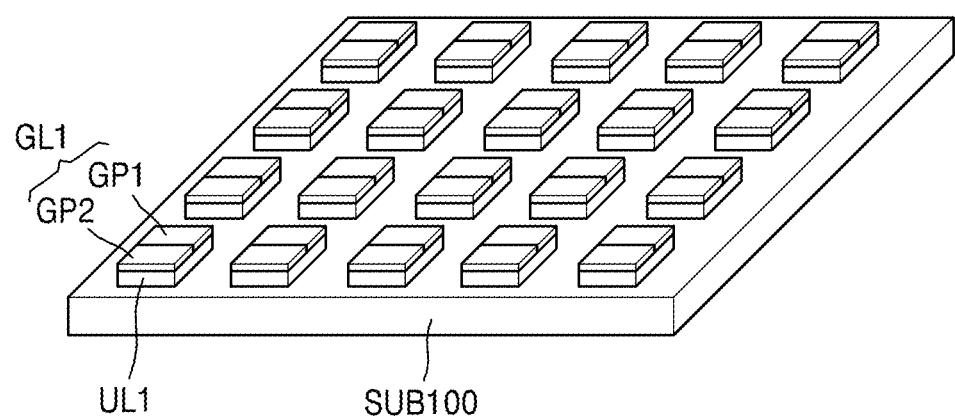

FIGS. 8A through 8C are perspective views illustrating a method of forming a graphene layer, according to another exemplary embodiment.

Referring to FIG. 8A, an under-material layer UL100 may be formed on a substrate SUB100. The substrate SUB100 may be formed of a material that is the same as or similar to those of the substrates SUB10 to SUB16 of FIGS. 1 through 7. The under-material layer UL100 may be formed from a material that is the same as or similar to those of underlayers UL10 to UL16 in FIGS. 1 through 7. The under-material layer UL100 may be a catalytic material layer that is a metal layer.

Referring to FIG. 8B, a plurality of underlayers UL1 that are separate from one another may be formed by patterning the under-material layer UL100. Each of the plurality of underlayers UL1 may be the same as or similar to the underlayers UL10 to UL16 of FIGS. 1 through 7.

Referring to FIG. 8C, a graphene layer GL1 may be formed on each of the plurality of underlayers UL1. The graphene layer GL1 may include a first graphene GL1 and a second graphene GP2. The first graphene GP1 and the second graphene GP2 may be joined to each other. One of the first and second graphenes GP1 and GP2 may be a P-type graphene, and the other one of the first and second graphenes GP1 and GP2 may be an N-type graphene. Accordingly, the graphene layer GL1 may have a P—N junction structure. A method of forming the graphene layer GL1 may be that same as or similar to the method of forming the graphene layer GL10 of FIG. 1E, the method of forming the graphene layer GL11 of FIG. 2D, or the method of forming the graphene layer GL12 of FIG. 3D. Although the graphene layer GL1 has a P—N structure, the graphene layer GL1 may have a PNP structure or an NPN structure. In order for the graphene layer GL1 to have the PNP structure or the NPN structure, a method of forming the graphene layer GL1 may be the same as or similar to those described with reference to FIGS. 4A through 7D.

When the graphene layer GL1 is formed on each of the plurality of underlayers UL1 after forming the plurality of underlayers UL1 by patterning the under-material layer UL100, as shown in FIGS. 8A through 8C, a plurality of graphene layers GL1 patterned in desired shapes may be easily formed.

If one graphene sheet is formed (or transferred) onto a substrate and then a plurality of graphene layers, which are separate from one another, are formed by patterning (etching) the graphene sheet, the edge portions of each graphene layer may be damaged as a result of the etching. In addition, a portion of the photoresist (PR) used in the patterning (etching) may remain on the plurality of graphene layers, and thus, the physical properties of the plurality of graphene layers and the characteristics of a device including the plurality of graphene layers may be degraded. Furthermore, it may be difficult to control the shapes and sizes of the plurality of graphene layers by using a method of directly patterning the graphene sheet. However, according to the current exemplary embodiment, the graphene layer GL1 is formed on each of the plurality of underlayers UL1 patterned in advance, and thus, the edge portions of the graphene layer GL1 may be prevented from being damaged and the PR may be prevented from remaining. In addition, since etching (patterning) for the under-material layer UL100 may be easier than directly etching (patterning) a graphene sheet, the size and shape of the graphene layer GL1 may be easily controlled by forming a patterned graphene layer GL1 on a patterned under-material layer UL100 after pattering (etching) the under-material layer UL100.

Figure 9:
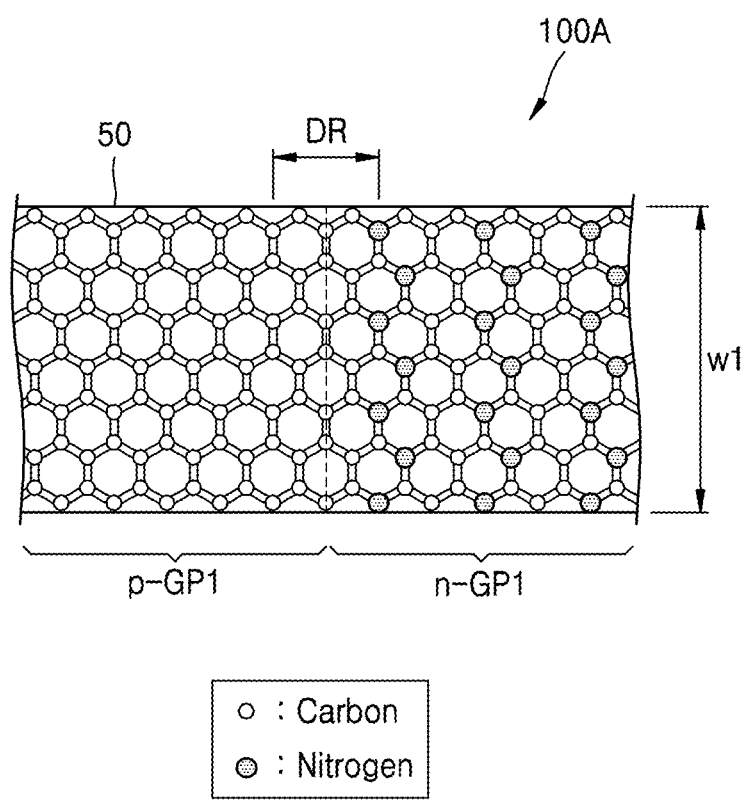
FIG. 9 is a view illustrating a structure of a graphene layer according to an exemplary embodiment.

FIG. 9 is a plan view illustrating a structure of a graphene layer according to an exemplary embodiment.

Referring to FIG. 9, the graphene layer 100A may be disposed on an underlayer 50. The graphene layer 100A may include a P-type graphene p-GP1 and an N-type graphene n-GP1. The N-type graphene n-GP1 may be joined to the side of the P-type graphene p-GP1. The N-type graphene n-GP1 may have a hexagonal crystalline structure formed from carbon (C) atoms, in which some carbon (C) atoms are substituted with first atoms. The first atoms may be, for example, nitrogen (N) atoms. The nitrogen (N) atoms may act as N-type dopants. Although, in the current embodiment, nitrogen (N) atoms form a hexagonal crystalline structure along with carbon (C) atoms, other atoms may be used instead of the nitrogen (N) atoms. The P-type graphene p-GP1 may have a hexagonal crystalline structure formed from only carbon (C) atoms. The P-type graphene p-GP1 may have P-type semiconductor characteristics due to doping effects by an underlayer 50 disposed under the P-type graphene p-GP1. The underlayer 50 may include a catalytic metal, such as Pt. However, the material of the underlayer 50 is not limited to Pt and may be changed in various manners.

In the current exemplary embodiment, a depletion region DR formed at the interface between the P-type graphene p-GP1 and the N-type n-GP1 may have, for example, a width of about 5 nm or less. The width of the depletion region DR may be about 2 nm or less. The width of the depletion region DR may be around 1 nm. According to the current embodiment, the N-type graphene n-GP1 may have N-type semiconductor characteristics since carbon (C) atoms are substituted with the first atoms (e.g., nitrogen (N) atoms). In this case, the first atoms (e.g., nitrogen (N) atoms) may be uniformly or relatively uniformly distributed in the entire N-type graphene n-GP1. The P-type graphene p-GP1 may have P-type semiconductor characteristics due to a change (rise) of the Dirac point by the underlayer 50. In such a case, the junction between the P-type graphene p-GP1 and the N-type graphene n-GP1 may have an atomic-scale size (width), and a depletion region DR having a very small width may be formed between the P-type graphene p-GP1 and the N-type graphene n-GP1. As described above, the depletion region DR may have a width in a range of from about 5 nm or less or about 2 nm or less. The N-doping effects caused by the nitrogen (N) atoms may disappear in a region that is at a distance greater than about 2 nm from a position where nitrogen (N) atoms exist. In this regard, the width of the depletion region DR may be about 2 nm or less. In addition, a boundary between the P-type graphene p-GP1 and the N-type graphene n-GP1, formed by the method described above, may not have defects or may have few defects. In this manner, since the width of the depletion region DR formed between the P-type graphene p-GP1 and the N-type graphene n-GP1 is relatively small and the boundary therebetween does not have defects or has few defects, the graphene layer 100A may have excellent physical properties and characteristics.

It may be difficult to form a graphene layer in which the width of a P—N junction's depletion region is relatively small by using existing methods or methods according to comparative examples. For example, when forming a P-type doping region and an N-type doping region in a graphene sheet by making different organic layers (molecular layers) contact the graphene sheet, it is difficult to control, on a small scale, the boundary between the P-type doping region and the N-type doping region, and thus, the boundary may not be distinct and P—N junction characteristics may be degraded. The boundary between the P-type doping region and the N-type doping region may have a width of tens of micrometers (μm) or more, for example, a width of about 100 μm. Accordingly, it is difficult to implement excellent P—N junction characteristics and it is difficult to manufacture a graphene device having a small size (width) of 100 μm or less. Such an issue may also occur identically (or similarly) in the case of depositing a metal oxide on a portion of a graphene sheet to form a P—N junction. However, according to the current exemplary embodiment, the boundary (depletion region) between the P-type graphene p-GP1 and the N-type graphene n-GP1 may be formed on a very small scale within several nanometers (nm), and thus, excellent P—N junction characteristics may be obtained and a graphene device having a small size may be easily manufactured.

In addition, according to the current exemplary embodiment, the uniformity of doping concentration may be improved in each of the N-type and P-type graphenes n-GP1 and p-GP1. For example, in each of the N-type and P-type graphenes n-GP1 and p-GP1, the deviation in doping concentration by region may be smaller than about $2.5\times10^{12}/cm^2$. In other words, in the n-type graphene n-GP1, the difference between the doping concentration of a first region having a maximum doping concentration and the doping concentration of a second region having a minimum doping concentration may be smaller than about $2.5\times10^{12}/cm^2$. On the other hand, it may be difficult to control the doping concentration and secure the uniformity of doping concentration by using a conventional method, for example, a method of contacting an organic layer, a method of depositing a metal oxide layer, or a method of using ion implantation. However, according to the current exemplary embodiment, nitrogen (N) atoms may be uniformly or almost uniformly distributed in the entire graphene (N-type graphene) since the nitrogen (N) atoms are used in the process of depositing the graphene (N-type graphene). Accordingly, uniformity in the doping concentration may be easily secured. In addition, in the method according to the current exemplary embodiment, the doping concentration of graphene may be easily controlled by adjusting the heating temperature or the concentration of the source gas when forming the graphene (N-type graphene). Here, it is noted that it is impossible in the conventional methods described above to form a crystalline structure in which some of the carbon (C) atoms are substituted with other atoms, whereas according to the current exemplary embodiment, a graphene in which some of the carbon (C) atoms are substituted with other atoms may be easily formed.

According to the current exemplary embodiment, the entire edge portion of the graphene layer 100A may have a defect-free crystalline structure. For example, the entire edge portion of the graphene layer 100A may have a defect-free zigzag structure. Since the graphene layer 100A is formed on the underlayer 50 without directly patterning (etching) the graphene sheet, the edge portion of the graphene layer 100A may be undamaged and may have a defect-free crystalline structure. Accordingly, the graphene layer 100A may have excellent characteristics and a graphene device using the graphene layer 100A may exhibit excellent performance.

The width w1 of the graphene layer 100A may be several nm to several hundred nm. The width w1 is a width in a short length direction of the graphene layer 100A. The width w1 of the graphene layer 100A may be, for example, about 500 nm or less or about 100 nm or less. When the graphene layer 100A is formed on a patterned underlayer 50 after the patterned underlayer 50 is formed, the graphene layer 100A may be formed so as to have a faultless edge portion while having a small width w1 of about 500 nm or less or about 100 nm or less. It may be difficult to form a graphene layer having a small width of about 1 μm or less by using an existing method, for example, the method of directly etching (patterning) a graphene sheet. In addition, when forming a graphene layer by using the existing methods, characteristics of the graphene layer may be degraded as a result of defects in an edge portion. Furthermore, photoresist PR used during the etching (patterning) may remain on the graphene layer, thereby degrading the characteristics of the graphene layer. According to the current exemplary embodiment, on the other hand, such problems may be prevented and solved, and a graphene layer having excellent characteristics may therefore be easily formed.

In addition, when a plurality of graphene layers are formed on a plurality of patterned underlayers after the plurality of patterned underlayers are formed (refer to FIG. 8C), the size and shape of each of the plurality of graphene layers may be easily controlled and, in addition, the interval between two adjacent graphene layers may be easily controlled within several tens of nm or to the extent of several nm. Accordingly, the methods and the structures according to the exemplary embodiments described above may be usefully applied to a device (for example, a device of FIG. 17C to be described later) using two adjacent graphene layers.

Figure 10:
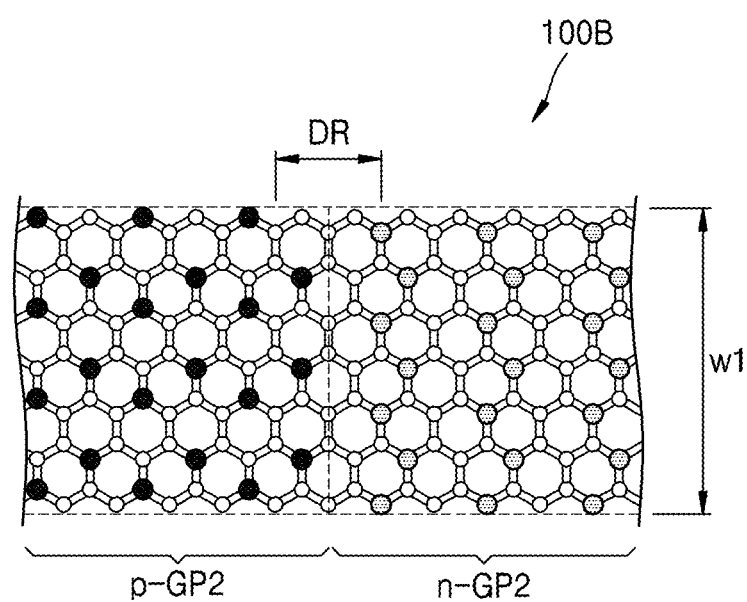
FIG. 10 is a view illustrating a structure of a graphene layer according to another exemplary embodiment.

FIG. 10 is a plan view illustrating a structure of a graphene layer according to another exemplary embodiment.

Referring to FIG. 10, the graphene layer 100B may include a P-type graphene p-GP2 and an N-type graphene n-GP2. The n-type graphene n-GP2 may have substantially the same crystalline structure as the n-type graphene n-GP1 of FIG. 9. The N-type graphene n-GP2 may have a hexagonal crystalline structure formed from carbon (C) atoms, in which some carbon (C) atoms are substituted with first atoms. The first atoms may be, for example, nitrogen (N) atoms. The P-type graphene p-GP2 may have a hexagonal crystalline structure formed from carbon (C) atoms, in which some carbon (C) atoms are substituted with second atoms that are different from the first atoms. The second atoms may be, for example, boron (B) atoms. The boron (B) atoms may act as P-type dopants. Although not illustrated in FIG. 10, an underlayer may be further disposed under the P-type and N-type graphenes p-GP2 and n-GP2. The underlayer may include a catalytic metal. Examples of the catalytic metal may include Pt, Cu, Ni, Ir, and the like.

In the current exemplary embodiment, a depletion region DR having a very small width may be formed in an interfacial portion between the P-type graphene p-GP2 and the N-type graphene n-GP2. The width of the depletion region DR may be from about 5 nm or less or about 2 nm or less. Each of the P-type and N-type graphenes p-GP2 and n-GP2 may have excellent doping uniformity. For example, in each of the P-type and N-type graphenes p-GP2 and n-GP2, the deviation in doping concentration by region may be smaller than about $2.5 \times 10^{12}/cm^2$. The entire edge portion of the graphene layer 100B may have a defect-free crystalline structure, for example, a defect-free zigzag structure. The width w1 of the graphene layer 100B is a width in a short length direction and may be several nm to several hundred of nm, for example, about 500 nm or less or about 100 nm or less.

The structure of the graphene layer 100A illustrated in FIG. 9 or the structure of the graphene layer 100B illustrated in FIG. 10 may correspond to that of any one of the graphene layers GL10 to GL16 and GL1 illustrated in FIGS. 1 through 8. In other words, at least a portion of any one of the graphene layers GL10 to GL16 and GL1 illustrated in FIGS. 1 through 8 may have the structure of the graphene layer 100A illustrated in FIG. 9 or the structure of the graphene layer 100B illustrated in FIG. 10. For example, the first graphene GP10 and the second graphene GP20 of FIG. 1E may correspond to the P-type graphene p-GP1 and the N-type graphene n-GP1 of FIG. 9, respectively. The first graphene GP11 and the second graphene GP21 of FIG. 2D may correspond to the P-type graphene p-GP1 and the N-type graphene n-GP1 of FIG. 9, respectively, or may correspond to the P-type graphene p-GP2 and the N-type graphene n-GP2 of FIG. 10, respectively.

In FIGS. 9 and 10, the size of honeycomb unit structures forming the hexagonal crystalline structures of the graphene layers 100A and 100B is arbitrarily determined for convenience's sake. However, the ratio of the actual length of the depletion region DR to the actual size of the honeycomb unit structures may be different from that illustrated in FIGS. 9 and 10. In other words, in FIGS. 9 and 10, although the length of the depletion region DR has a length equal to the combined length of two honeycomb unit structures, the actual length of the depletion region DR may be different therefrom. In addition, the ratio between the size of the honeycomb unit structures and the width w1 of the graphene layers 100A and 100B in FIGS. 9 and 10 may be different from that of an actual embodiment.

Figure 11:
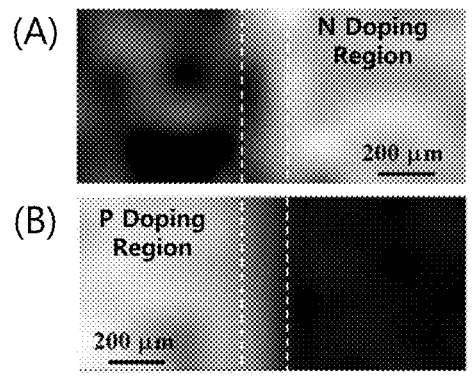
FIG. 11 illustrates X-ray photoelectron spectroscopy (XPS) images for a graphene layer having a P—N junction, formed by a method according to a comparative example.

FIG. 11 illustrates X-ray photoelectron spectroscopy (XPS) images for a graphene layer having a P—N junction, formed by a method according to a comparative example.

FIG. 11 illustrates images captured in different ways with respect to the same graphene layer. View (A) of FIG. 11 illustrates an image captured so that a region including an N-type doping material is brightly seen, and view (B) of FIG. 11 illustrates an image captured so that a region including a P-type doping material is brightly seen. The graphene layer according to the comparative example is formed by forming a pattern layer of 3-aminopropyltriethoxysilane (APTES) and a pattern of perfluorooctyltriethoxy silane (PFES) via lithography, transferring a graphene sheet onto the patterns, and then annealing. In the annealing process, P-type and N-type doping regions may be formed in a graphene sheet by the APTES and the PFES.

Referring to FIG. 11, the boundary between the N-type doping region and the P-type doping region is not sharp. That is, the overlapping portion between the N-type doping region and the P-type doping region is considerably wide. The width of the overlapping portion between the N-type doping region and the P-type doping region is about 100 μm. This means that in the graphene layer formed by the method according to the comparative example, the depletion region between the N-type doping region and the P-type doping region is very wide. It may be difficult to manufacture a graphene device having a width of about 100 μm or less by using the method according to the comparison example.

Figure 12:
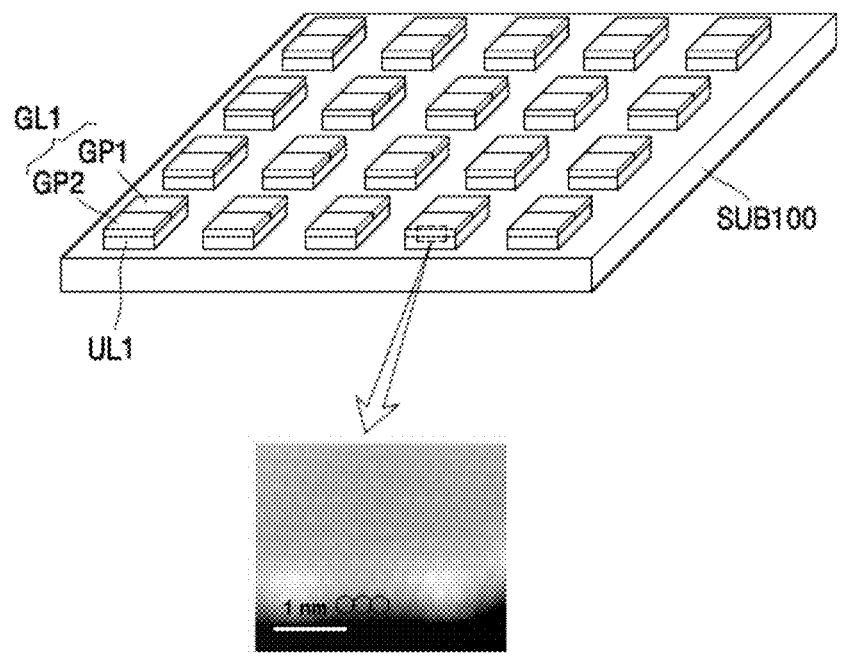
FIG. 12 is a diagram illustrating a graphene layer according to an exemplary embodiment and a structure of an edge portion thereof.

FIG. 12 is a diagram illustrating a graphene layer GL1 according to an exemplary embodiment and the structure of an edge portion thereof. FIG. 12 includes a scanning tunneling microscopy (STM) image captured with respect to the edge portion of the graphene layer.

Referring to FIG. 12, the edge portion of the graphene layer GL1 has a defect-free zigzag structure. The edge portion may have a uniform crystalline structure. A plurality of patterned underlayers (catalytic metal layers) UL1 on a substrate SUB100, and the graphene layer GL1 may be formed on each patterned underlayer UL1. The graphene layer GL1 may include a first graphene GP1 and a second graphene GP2, and one of the first and second graphenes GP1 and GP2 may be a P-type graphene and the other one of the first and second graphenes GP1 and GP2 may be an N-type graphene. The graphene layer GL1 may be the same as that described with reference to FIG. 8C.

Figure 13:
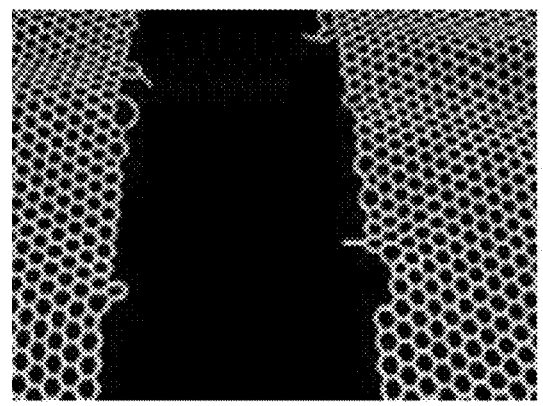
FIG. 13 is a diagram illustrating a structure of an edge portion of a graphene layer according to a comparative example.

FIG. 13 is a diagram illustrating the structure of an edge portion of a graphene layer according to a comparative example.

Referring to FIG. 13, when a graphene layer is formed via a method of directly patterning (etching) a graphene sheet, many defects may occur in the edge portion of the graphene layer. In addition, the crystalline structure of the edge portion may be non-uniform. Accordingly, the electrical characteristics of the graphene layer formed via such a method may be degraded. In addition, when the graphene sheet is directly patterned (etched), a portion of a PR used for the patterning (etching) may remain on the graphene layer, and thus, characteristics of the graphene layer may be deteriorated.

A method of manufacturing a device (i.e., a graphene-containing device) including a graphene layer, according to an exemplary embodiment is described below.

Figure 14A:
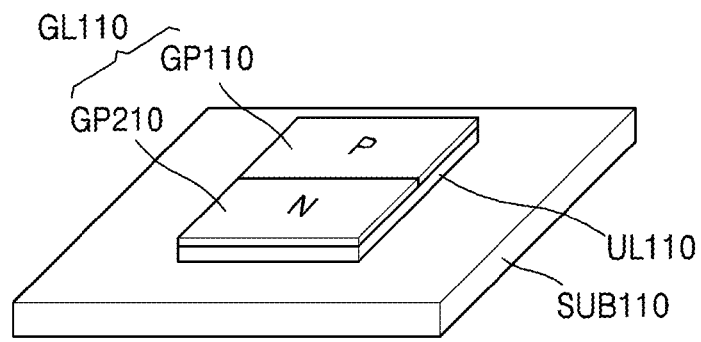
FIGS. 14A through 14C are perspective views illustrating a method of manufacturing a graphene-containing device, according to an exemplary embodiment.
Figure 14B:
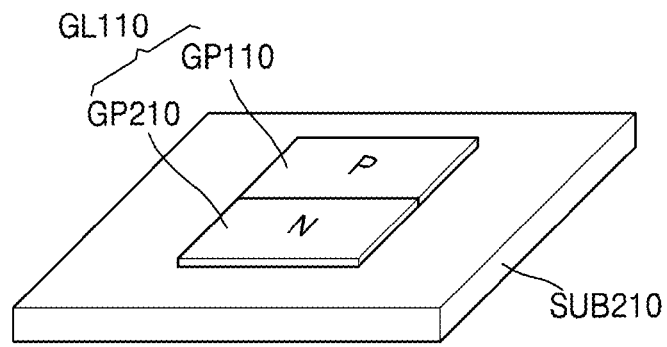
Figure 14C:
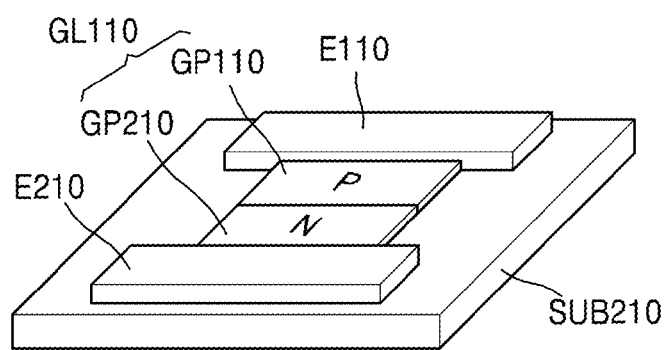

FIGS. 14A through 14C are perspective views illustrating a method of manufacturing a graphene-containing device, according to an exemplary embodiment.

Referring to FIG. 14A, a graphene layer GL110 having a P—N junction structure may be formed on an underlayer UL110 after the underlayer UL110 is formed on a first substrate SUB110. The graphene layer GL110 may include a first graphene GP110 and a second graphene GP210. The first graphene GP110 may be a P-type graphene, and the second graphene GP210 may be an N-type graphene. The method of forming the graphene layer GL110 on the first substrate SUB110 may be the same as or similar to that described with reference to FIGS. 1 through 8.

Referring to FIG. 14B, the graphene layer GL110 on the first substrate SUB110 may be transferred to a second substrate SUB210. The method of transferring the graphene layer GL110 from the first substrate SUB110 to the second substrate SUB210 may be a generally-known graphene transfer method. The second substrate SUB210 may be a semiconductor substrate or an insulating substrate. The semiconductor substrate may be, for example, a silicon substrate. When a semiconductor substrate is used as the second substrate SUB210, the graphene layer GL110 may be transferred onto an insulating layer after the insulating layer is formed on the semiconductor substrate. A conductive substrate may also be used as the second substrate SUB210. In this case, the graphene layer GL110 may be transferred onto an insulating layer after the insulating layer is formed on the conductive substrate.

Referring to FIG. 14C, a device portion including the graphene layer GL110 may be formed on the second substrate SUB210. For example, a first electrode E110 electrically connected to and contacting the first graphene GP110 may be formed on the second substrate SUB210, and a second electrode E210 electrically connected to and contacting the second graphene GP210 may be formed on the second substrate SUB210. Since the graphene layer GL110 has a P—N junction structure, the graphene layer GL110 and the first and second electrodes E110 and E210 being in contact with the graphene layer GL110 may form a diode device.

Figure 15A:
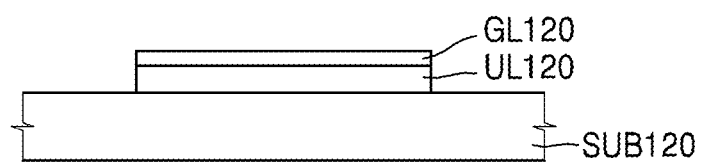
FIGS. 15A through 15C are cross-sectional views illustrating a method of manufacturing a graphene-containing device, according to another exemplary embodiment.
Figure 15B:
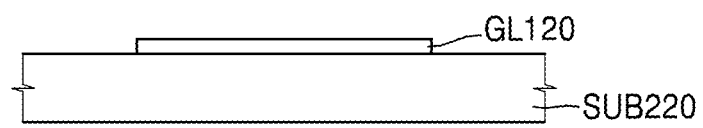
Figure 15C:
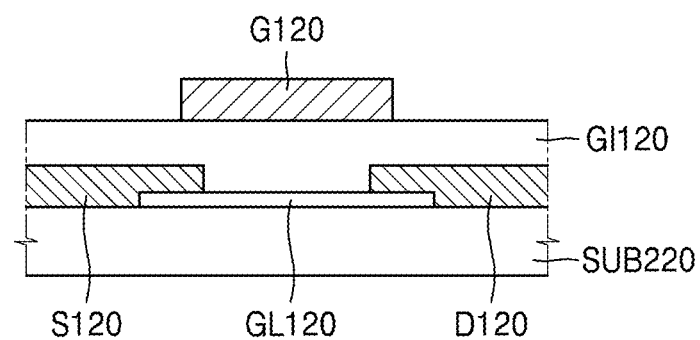

FIGS. 15A through 15C are cross-sectional views illustrating a method of manufacturing a graphene-containing device, according to another exemplary embodiment.

Referring to FIG. 15A, an underlayer UL120 and a graphene layer GL120 may be sequentially formed on a first substrate SUB120. The method of sequentially forming the underlayer UL120 and the graphene layer GL120 on the first substrate SUB120 may be the same as or similar to that described with reference to FIGS. 1 through 8.

Referring to FIG. 15B, the graphene layer GL120 on the first substrate SUB120 may be transferred onto a second substrate SUB220. The method of transferring the graphene layer GL120 onto the second substrate SUB220 may be the same as or similar to the transfer method described with reference to FIG. 14B. The material of the second substrate SUB220 may also be the same as or similar to that of the second substrate SUB210 of FIG. 14B.

Referring to FIG. 15C, a device portion including the graphene layer GL120 may be formed on the second substrate SUB220. In the current exemplary embodiment, a source electrode S120 and a drain electrode D120, which contact both ends of the graphene layer GL120, may be formed. Next, a gate insulating layer GL120 may be formed to cover the source electrode S120, the drain electrode D120, and the graphene layer GL120 between the source electrode S120 and the drain electrode D120, and a gate electrode G120 may be formed on the gate insulating layer GL120. The gate electrode G120 may be disposed on the graphene layer GL120.

The device portion of FIG. 15C may be a transistor, and the graphene layer GL120 may be used as a channel layer in the transistor. In this case, the graphene layer GL120 may have a PNP structure or an NPN structure. When the graphene layer GL120 has a PNP structure, the source electrode S120 and the drain electrode D120 may respectively contact different P-type regions of the graphene layer GL120. When the graphene layer GL120 has an NPN structure, the source electrode S120 and the drain electrode D120 may respectively contact different N-type regions of the graphene layer GL120. The transistor of FIG. 15C may have a top-gate structure in which the gate electrode G120 is disposed on the graphene layer GL120, which may be used as a channel layer in the transistor.

Figure 16A:
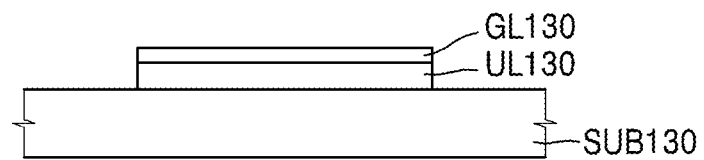
FIGS. 16A through 16C are cross-sectional views illustrating a method of manufacturing a graphene-containing device, according to another exemplary embodiment.
Figure 16B:
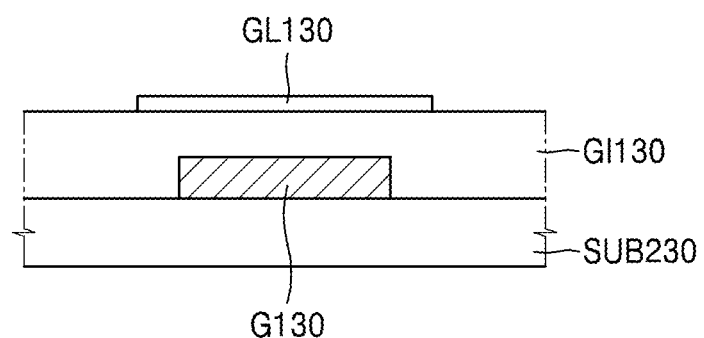
Figure 16C:
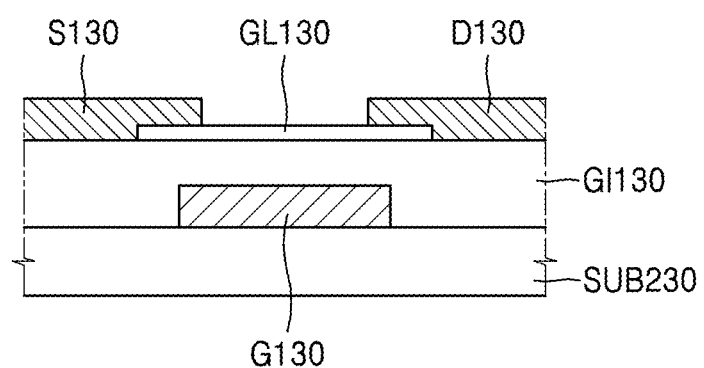

FIGS. 16A through 16C are cross-sectional views illustrating a method of manufacturing a graphene-containing device, according to another exemplary embodiment.

Referring to FIG. 16A, an underlayer UL130 and a graphene layer GL130 may be sequentially formed on a first substrate SUB130. This structure may be the same as or similar to the structure of FIG. 15A.

Referring to FIG. 16B, the graphene layer GL130 on the first substrate SUB130 may be transferred onto a second substrate SUB230. After a gate electrode G130 is formed on the second substrate SUB230 and a gate insulating layer GL130 is formed to cover the gate electrode G130, the graphene layer GL130 may be transferred onto the gate insulating layer GL130. The method of transferring the graphene layer GL130 may be the same as or similar to the transfer method described with reference to FIG. 14B.

Referring to FIG. 16C, a source electrode S130 and a drain electrode D130, which contact both ends of the graphene layer GL130, may be formed on the gate insulating layer GL130. The device of FIG. 16C may be a transistor having a bottom-gate structure, and the graphene layer GL130 may be used as a channel layer. The graphene layer GL130 may have a PNP junction structure or an NPN junction structure.

Figure 17A:
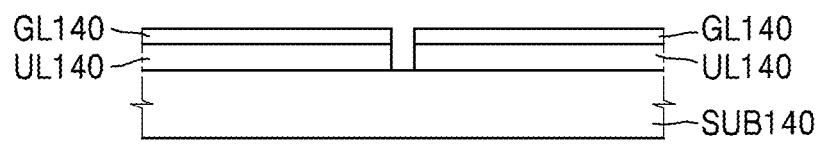
FIGS. 17A through 17C are cross-sectional views illustrating a method of manufacturing a graphene-containing device, according to another exemplary embodiment.
Figure 17B:
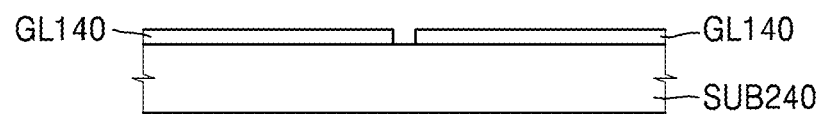
Figure 17C:
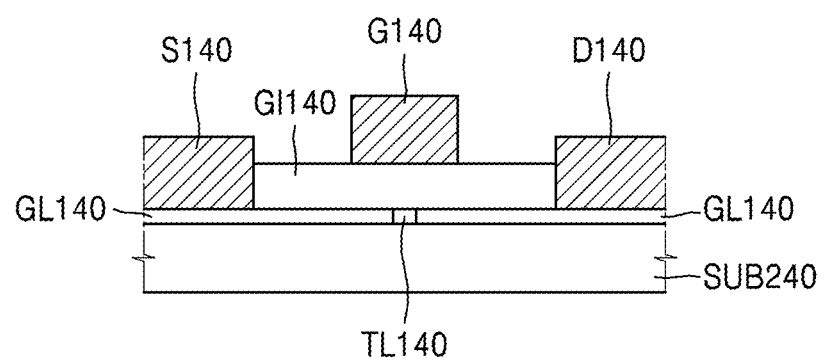

FIGS. 17A through 17C are cross-sectional views illustrating a method of manufacturing a graphene-containing device, according to another exemplary embodiment.

Referring to FIG. 17A, a plurality of underlayers UL140 may be formed on a first substrate SUB140 and a plurality of graphene layers GL140 may be formed on the plurality of underlayers UL140. The structure of FIG. 17A may be formed by using a method that is the same as or a similar to that described with reference to FIGS. 8A through 8C.

Referring to FIG. 17B, the plurality of graphene layers GL140 on the first substrate SUB140 may be transferred onto a second substrate SUB240. A method of transferring the plurality of graphene layers GL140 may be the same as or similar to the transfer method described with reference to FIG. 14B.

Referring to FIG. 17C, a device portion including the plurality of graphene layers GL140 may be formed on the second substrate SUB240. In the current embodiment, a gate insulating layer GL140 may be formed on a tunneling layer TL140 and the plurality of graphene layers GL140 after the tunneling layer TL140, filling a region between the plurality of graphene layers, GL140 is formed. Next, a gate electrode G140 may be formed on the gate insulating layer GL140, and a source electrode S140 and a drain electrode D140, electrically connected to and contacting the graphene layers GL140, may be formed. The width of the tunneling layer TL140 and the material used to form the tunneling layer TL140 may be chosen such that Fowler-Nordheim tunneling of electric charges may occur therein. For example, the width of the tunneling layer TL140 may be from about several nm to about several tens of nm.

The device portion of FIG. 17C may be a field effect transistor (FET) using a tunneling effect. In this regard, the device portion of FIG. 17C may be referred to as a kind of tunneling device.

According to the current exemplary embodiment, the interval between two graphene layers GL140 may be easily controlled within about several tens of nm or to the extent of about several nm, and thus, a device having a structure as shown in FIG. 17C may be easily manufactured. In addition, edge portions of the two graphene layers GL140 grown on the underlayers UL140 may have defect-free crystalline structures, and thus the performance of the device may be improved.

Although in the methods of FIGS. 14A through 17C a graphene-containing device is manufactured on a second substrate after transferring a graphene layer from a first substrate to the second substrate, the graphene-containing device may be manufactured on the first substrate without performing the step of transferring. An example of this case is illustrated in FIGS. 18A and 18B.

Figure 18A:
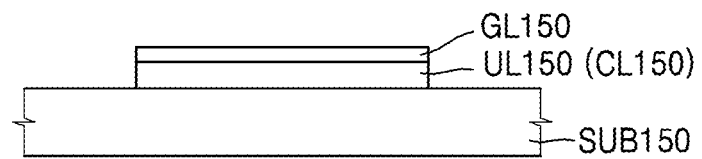
FIGS. 18A and 18B are cross-sectional views illustrating a method of manufacturing a graphene-containing device, according to another exemplary embodiment.
Figure 18B:
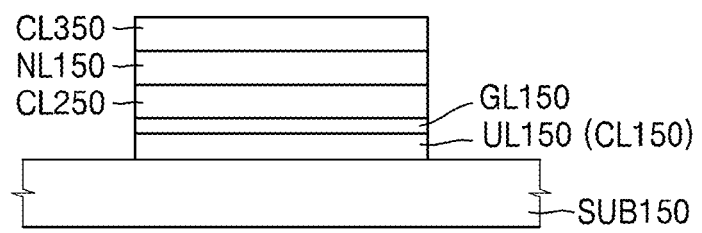

FIGS. 18A and 18B are cross-sectional views illustrating a method of manufacturing a graphene-containing device, according to another exemplary embodiment.

Referring to FIG. 18A, an underlayer UL150 and a graphene layer GL150 may be sequentially formed on a first substrate SUB150. The structure of FIG. 18A may be the same as or similar to that of FIG. 15A. The underlayer UL150 may be a conductive layer, for example, a metal layer, and the graphene layer GL150 may be a semiconductor layer including a P—N junction. Below, the underlayer UL150 is referred to as a first conductive layer CL150.

Referring to FIG. 18B, a device portion including the graphene layer GL150 may be formed on the first substrate SUB150. In the current exemplary embodiment, a second conductive layer CL250, an insulating layer NL150, and a third conductive layer CL350 may be sequentially formed on the graphene layer GL150.

The device portion of FIG. 18B may be a tunneling device. The graphene layer GL150 may be a tunneling layer. The first conductive layer CL150 may be a drain electrode, the second conductive layer CL250 may be a source electrode, and the third electrode CL150 may be a gate electrode. The insulating layer NL150 may be a gate insulating layer. Electrical characteristics of the graphene layer GL150 or the characteristics of an interface between the second conductive layer CL250 and the graphene layer GL150 may be controlled by the third conductive layer CL350. Current may flow between the first conductive layer CL150 and the second conductive layer CL250 by the tunneling of electric charges through the graphene layer GL150.

A graphene layer according to an exemplary embodiment may be applied to various devices (e.g., semiconductor devices and electronic devices) for various purposes. For example, a graphene layer according to an exemplary embodiment may be applied to various devices, such as diodes, transistors, tunneling devices, memory devices, solar cells, photodetectors, sensors, light-emitting devices, logic devices, energy storage devices, and display devices. The transistors may have various structures, such as a field effect transistor (FET) structure, a thin film transistor (TFT) structure, a binary junction transistor (BJT) structure, and a barrier transistor (barristor) structure. The sensors may be optical sensors or gas sensors or may be sensors using graphene arrays. The graphene layer may be applied to every device using a P—N junction, may be used instead of silicon (Si) in a device using Si, and may be applied to stackable devices, flexible devices, and transparent devices. Since the graphene layer may be flexible and have transparent properties, the graphene layer may be usefully/advantageously applied to flexible devices and transparent devices. In addition, a device including the graphene layer may be applied to various integrated circuits.

Figure 19:
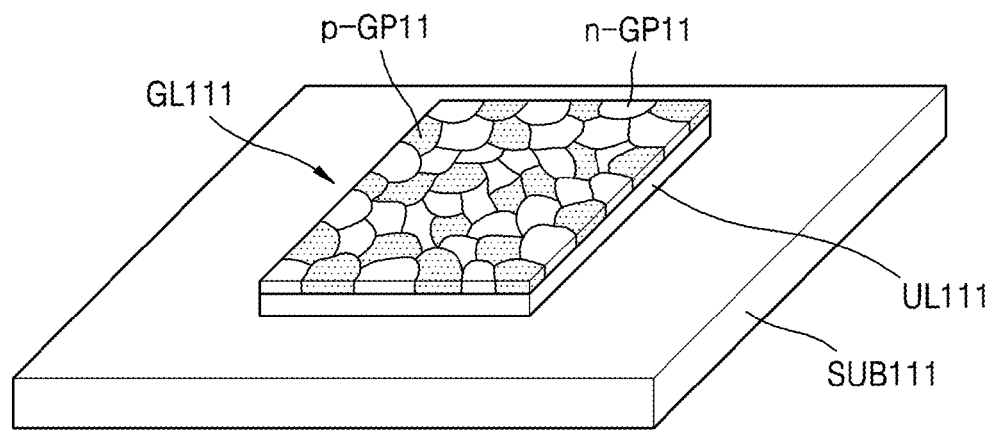
FIG. 19 is a perspective view illustrating a graphene layer according to another exemplary embodiment.

According to another exemplary embodiment, a graphene layer may have a structure (hereinafter, referred to as a random structure) in which a P-type region (or a plurality of P-type regions) and an N-type region (or a plurality of N-type regions) are irregularly and randomly disposed. In the exemplary embodiment of FIGS. 1A through 1E, a region in which a first graphene (e.g., P-type graphene) and a second graphene (e.g., N-type graphene) are formed is defined by using the mask layer ML10. However when process conditions are controlled without using the mask layer ML10, the random structure may be formed. An example of a graphene layer having the random structure is illustrated in FIG. 19. In FIG. 19, reference numeral SUB111 denotes a substrate, reference numeral UL111 denotes an underlayer, reference numeral GL111 denotes a graphene layer, reference numeral p-GP11 denotes a P-type graphene, and reference numeral n-GP11 denotes an N-type graphene. A plurality of P-type graphenes p-GP11 and a plurality of N-type graphenes n-GP11, which have irregular shapes, may be randomly disposed on the underlayer UL111. For example, a process for forming P-type graphene under certain conditions may be performed on the underlayer UL11 for a predetermined time to form the plurality of P-type graphenes p-GP11. At this time, the plurality of P-type graphenes p-GP11 may not be formed to cover the whole upper surface of the underlayer UL11. In this regard, the duration time of the process may be controlled. Then, a process for forming N-type graphene under certain conditions may be performed on the underlayer UL11 to form the plurality of N-type graphenes n-GP11 between the plurality of P-type graphenes p-GP11. At this time, the N-type graphene may be formed on the exposed regions of the underlayer UL11 between the plurality of P-type graphenes p-GP11, but may not be formed on the plurality of P-type graphenes p-GP11. As a result, the graphene layer GL111 may be obtained. In other cases, the plurality of N-type graphenes n-GP11 may be formed first, and then, the plurality of P-type graphenes p-GP11 may be formed. Various devices including the graphene layer GL111 may be manufactured in a state in which the graphene layer GL111 having the random structure is transferred or not transferred onto another substrate (not shown).

Figure 20:
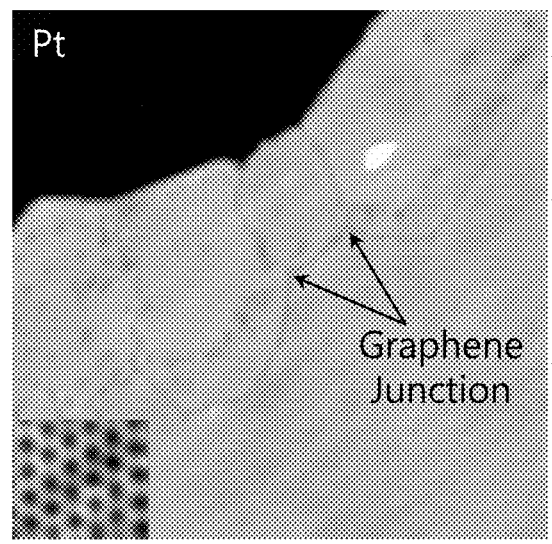
FIG. 20 is a diagram illustrating a scanning tunneling microscopy (STM) image of a graphene layer formed according to an exemplary embodiment.

FIG. 20 is a diagram illustrating a scanning tunneling microscopy (STM) image of a graphene layer formed according to an exemplary embodiment.

Referring to FIG. 20, a plurality of graphenes may be formed in contact with each other on a Pt layer. The boundaries between the plurality of graphenes is clearly seen in the STM image. The structure of the graphene layer shown in FIG. 20 may be similar to the random structure described with reference to FIG. 19. An enlarged view of a portion of a graphene (P-type graphene) is illustrated in a lower left corner of FIG. 20. A hexagonal crystalline structure may be found in the enlarged view.

Figure 21:
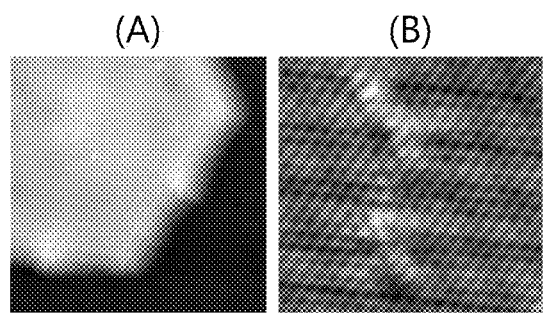
FIG. 21 illustrates STM images of an N-type graphene formed according to an exemplary embodiment.

FIG. 21 illustrates STM images of an N-type graphene formed according to an exemplary embodiment. View (B) of FIG. 21 is an enlarged view of a portion of view (A) of FIG. 21, and the crystalline structure of the N-type graphene may be roughly seen in view (B) of FIG. 21. The N-type graphene of FIG. 21 has a structure in which in a hexagonal crystalline structure formed from carbon (C) atoms, some of the carbon (C) atoms are substituted with nitrogen (N) atoms. That is, the STM image of view (B) of FIG. 21 may correspond to the N-type graphenes n-GP1 and n-GP2 of FIGS. 9 and 10.

FIGS. 22 through 26 are diagrams showing chemical structures of various source gases that may be used for forming graphenes according to the exemplary embodiments described above.

Figure 22:
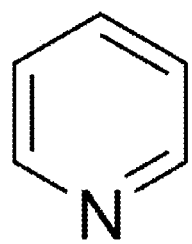
FIGS. 22 through 26 are diagrams showing chemical structures of various source gases that may be used for forming graphenes according to the exemplary embodiments.
Figure 23:
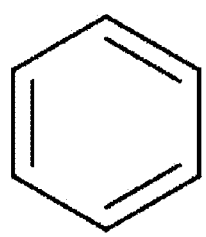
Figure 24:
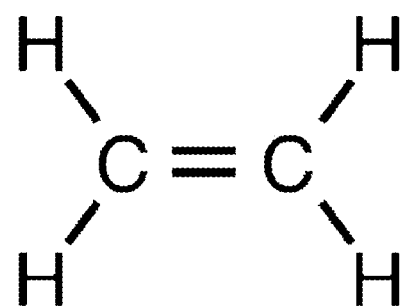
Figure 25:
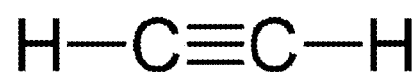
Figure 26:
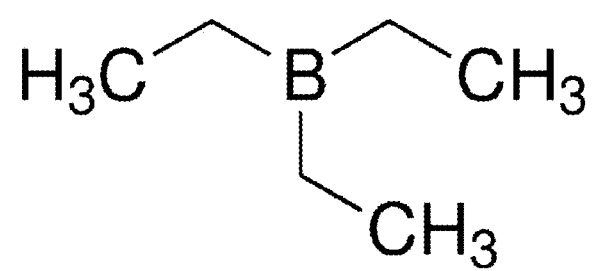

FIG. 22 shows the chemical structure of $C_5H_5N$, FIG. 23 shows the chemical structure of $C_6H_6$, FIG. 24 shows the chemical structure of $C_2H_4$, FIG. 25 shows the chemical structure of $C_2H_2$, and FIG. 26 shows the chemical structure of $C_6H_{15}B$. Materials having chemical structures shown in FIGS. 22 through 26 may be used in the graphene layer forming methods described with reference to FIGS. 1A through 8C. However, materials (source gases) that may be used in the exemplary embodiments are not limited to those shown in FIGS. 22 through 26, and other materials may be used as source gases.

While embodiments have been described above, they should not be construed as limiting the scope of the invention, but rather merely as examples. For example, it will be understood by those of ordinary skill in the art that various changes may be made to the graphene layer forming methods described with reference to FIGS. 1A through 8C. The graphene layer structures illustrated in FIGS. 9 and 10, the graphene-containing devices illustrated in FIGS. 14A through 18B, and the methods of manufacturing the graphene-containing devices may also be modified in various ways. For example, a first graphene (e.g., P-type graphene) and a second graphene (e.g., N-type graphene) of a graphene layer may not be directly joined to each other, and the graphene layer may have a form other than a tetragon (e.g., a rectangle) and may have a multi-atomic layer structure rather than a single atomic layer structure. The disclosed concept and principle may also be applied to a graphene layer that does not have a P—N junction structure, or to a two-dimensional material layer that is similar to the graphene layer. Therefore, the scope of the disclosed concept is not strictly limited to the detailed description above.

It should be understood that the exemplary embodiments described herein should be considered to be descriptive only, and do not limit the present disclosure. Descriptions of features or aspects within each embodiment should typically be considered as being available for other similar features or aspects in other embodiments.

What is claimed is:

1. A method of forming a graphene layer, the method comprising:
   forming a first graphene on a first region of an underlayer at a first temperature using a first source gas, the first graphene having an exposed lateral side; and
   forming a second graphene on a second region adjacent to the first region of the underlayer at a second temperature using a second source gas after the forming of the first graphene, the second graphene being joined to the exposed lateral side of the first graphene,
   wherein the first graphene is a P-type graphene, the second graphene is an N-type graphene, and the first graphene and the second graphene together form a P-N junction, and
   wherein the P-type graphene is formed at the first temperature, and after the forming of the P-type graphene, the N-type graphene is formed at the second temperature which is lower than the first temperature.

2. The method of claim 1, wherein the first source gas and the second source gas are the same as each other, and the first temperature and the second temperature are different from each other.

3. The method of claim 2, wherein the first source gas and the second source gas each comprise a hydrocarbon compound containing nitrogen (N).

4. The method of claim 3, wherein the hydrocarbon compound comprises pyridine ($C_5H_5N$).

5. The method of claim 2, wherein the first temperature greater than or equal to 700° C. and the second temperature is less than or equal to 550° C.

6. The method of claim 1, wherein the first graphene is the P-type graphene resulting from doping effects by the underlayer, and the second graphene is the N-type graphene resulting from N-type dopants from the second source gas.

7. The method of claim 1, wherein the underlayer comprises a catalytic metal.

8. The method of claim 7, wherein the catalytic metal comprises platinum (Pt).

9. The method of claim 1, wherein the first source gas and the second source gas are different from each other.

10. The method of claim 9, wherein one of the first and second source gases comprises a first hydrocarbon compound and the other of the first and second source gases comprises a second hydrocarbon compound; wherein the first hydrocarbon compound does not contain nitrogen (N), and the second hydrocarbon compound contains nitrogen (N).

11. The method of claim 10, wherein the first graphene formed using the first hydrocarbon compound is the P-type graphene, and the second graphene formed using the second hydrocarbon compound is the N-type graphene.

12. The method of claim 10, wherein the first hydrocarbon compound comprises at least one gas selected from the group consisting of benzene ($C_6H_6$), ethylene ($C_2H_4$), acetylene ($C_2H_2$), and triethylborane ($C_6H_{15}B$).

13. The method of claim 10, wherein the first hydrocarbon compound comprises boron (B).

14. The method of claim 10, wherein the second hydrocarbon compound comprises pyridine ($C_5H_5N$).

15. The method of claim 1, further comprising forming a third graphene joined to the first graphene or the second graphene,
   wherein the third graphene is a P-type graphene or an N-type graphene.

16. The method of claim 15, wherein the graphene layer has a PNP structure or an NPN structure.

17. The method of claim 15, wherein the third graphene is formed at a temperature less than 550° C.

18. The method of claim 1 further comprising forming the underlayer, wherein the forming the underlayer comprises:
   forming an under-material layer on a substrate; and
   forming a plurality of underlayers, which are separate from each other, by patterning the under-material layer.

19. A method of manufacturing a graphene-containing device, the method comprising:
   forming a graphene layer comprising a P-N junction by using the method of claim 1; and forming a portion of the graphene-containing device, wherein the portion comprises the graphene layer.

20. The method of claim 19, wherein the graphene layer is formed on a first substrate, and the portion of the graphene-containing device is formed on a second substrate after the graphene layer is transferred from the first substrate to the second substrate.

21. The method of claim 19, wherein the graphene layer is formed on a first substrate, and the portion of the graphene-containing device is formed on the first substrate.

22. A graphene layer comprising:
a P-type graphene; and
an N-type graphene joined to a side of the P-type graphene,
wherein a depletion region is formed at an interface between the P-type graphene and the N-type graphene and has a width that is less than or equal to 5 nm,
wherein an entire edge portion in the whole region of the graphene layer has a defect-free zigzag structure, and
wherein in each of the P-type graphene and the N-type graphene, a deviation in doping concentration by region is smaller than about $2.5 \times 10^{12}/cm^2$.

23. The graphene layer of claim 22, wherein the width of the depletion region is less than or equal to 2 nm.

24. A graphene-containing device comprising the graphene layer of claim 22.

25. The graphene-containing device of claim 24, wherein the graphene-containing device is a diode and further comprises a first electrode connected to the P-type graphene and a second electrode connected to the N-type graphene.

26. The graphene-containing device of claim 24, wherein the graphene-containing device is a transistor, and the graphene layer is a channel layer in the transistor.

27. The graphene-containing device of claim 26, wherein the graphene layer comprises the P-type graphene, the N-type graphene, and another P-type or N-type graphene, and has a PNP junction structure or an NPN junction structure.

28. The graphene-containing device of claim 26, wherein the graphene-containing device is one of a tunneling device, a binary junction transistor (BJT), a barristor, a field effect transistor (FET), a memory device, a solar cell, a photodetector, a sensor, and a light-emitting device.

29. A method of forming a graphene layer, the method comprising:
forming a first P-type graphene on a first region of an underlayer at a temperature of from about 700° C. to about 1200° C. by using a first source gas; and
forming a first N-type graphene on a second region adjacent to the first region of the underlayer at a temperature of from about 450° C. to about 550° C. by using a second source gas,
wherein the first P-type graphene and the first N-type graphene are in direct contact with each other at an interface, and
forming a depletion region having a width that is less than or equal to 5 nm at the interface between the P-type graphene and the N-type graphene,
wherein the method further comprises forming a second P-type graphene or a second N-type graphene joined to the first P-type graphene or the first N-type graphene, and the second P-type graphene or the second N-type graphene is formed at a temperature less than 550° C., in which the temperature less than 550° C. is less than the temperature at which the first N-type graphene is formed.

30. The method of claim 29, wherein the width of the depletion region is less than or equal to 2 nm.

31. The method of claim 29, wherein the graphene layer has a PNP structure or an NPN structure.

32. The method of claim 29, wherein the first source gas does not contain nitrogen (N), and the second source gas contains nitrogen (N).

33. The method of claim 29, wherein the first source gas comprises at least one gas selected from the group consisting of benzene ($C_6H_6$), ethylene ($C_2H_4$), acetylene ($C_2H_2$), and triethylborane ($C_6H_{15}B$), and the second source gas comprises pyridine ($C_5H_5N$).

34. The method of claim 29, wherein the first N-type graphene has a crystalline structure formed from carbon (C) atoms, in which some of the carbon (C) atoms are substituted with first atoms, and the first P-type graphene has a crystalline structure formed from only carbon (C) atoms or a structure in which some carbon (C) atoms of the crystalline structure are substituted with second atoms that are different from the first atoms.

35. The method of claim 29, wherein an entire edge portion of the graphene layer has a defect-free zigzag structure.

36. The method of claim 29, wherein in the P-type graphene or the N-type graphene, a deviation in doping concentration by region is smaller than about $2.5 \times 10^{12}/cm^2$.

* * * * *